US011476434B2

(12) United States Patent
Lee et al.

(10) Patent No.: US 11,476,434 B2
(45) Date of Patent: Oct. 18, 2022

(54) ELECTROLUMINESCENT DEVICE AND DISPLAY DEVICE COMPRISING THEREOF

(71) Applicant: SAMSUNG ELECTRONICS CO., LTD., Suwon-si (KR)

(72) Inventors: Heejae Lee, Seongnam-si (KR); Moon Gyu Han, Suwon-si (KR); Sung Woo Kim, Hwaseong-si (KR); Tae Ho Kim, Seongnam-si (KR); Kun Su Park, Seongnam-si (KR); Eun Joo Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 71 days.

(21) Appl. No.: 17/085,923

(22) Filed: Oct. 30, 2020

(65) Prior Publication Data

US 2021/0135139 A1    May 6, 2021

(30) Foreign Application Priority Data

Oct. 31, 2019  (KR) .................. 10-2019-0137993

(51) Int. Cl.
  *H01L 51/50*  (2006.01)
  *H01L 51/00*  (2006.01)

(52) U.S. Cl.
  CPC ........ *H01L 51/502* (2013.01); *H01L 51/0003* (2013.01); *H01L 51/0026* (2013.01); *H01L 2251/552* (2013.01); *H01L 2251/558* (2013.01)

(58) Field of Classification Search
  CPC . H01L 51/502; H01L 51/504; H01L 51/0037; H01L 51/0039
  See application file for complete search history.

(56) References Cited

U.S. PATENT DOCUMENTS

| 7,910,400 | B2 | 3/2011 | Kwon et al. |
| 9,073,752 | B2 | 7/2015 | Kang et al. |
| 9,978,974 | B2 | 5/2018 | Kim et al. |
| 10,367,162 | B1 | 7/2019 | Boardman et al. |
| 10,533,127 | B2 | 1/2020 | Park et al. |
| 2018/0019371 | A1 | 1/2018 | Steckel et al. |
| 2019/0214594 | A1 | 7/2019 | Jang et al. |
| 2020/0411719 | A1 | 12/2020 | Kimoto |

FOREIGN PATENT DOCUMENTS

| CN | 102593206 | 7/2012 |
| CN | 106450013 A | 2/2017 |
| CN | 106430090 | 7/2017 |
| CN | 106887482 | 9/2018 |

(Continued)

OTHER PUBLICATIONS

Extended European Search Report—European Patent Application No. 20204911.0 dated Mar. 3, 2021, citing references listed within.

(Continued)

*Primary Examiner* — Anthony Ho
(74) *Attorney, Agent, or Firm* — Cantor Colburn LLP

(57) ABSTRACT

An electroluminescent device includes a first electrode and a second electrode facing each other, and a light emitting layer disposed between the first electrode and the second electrode, where the light emitting layer includes a first light emitting layer including a first quantum dot and a second light emitting layer including a second quantum dot and an n-type metal oxide.

20 Claims, 13 Drawing Sheets

(56) References Cited

FOREIGN PATENT DOCUMENTS

| GB | 2516930 A | 2/2015 |
|----|-----------|--------|
| KR | 100754396 | 8/2007 |
| KR | 101415727 | 7/2014 |
| KR | 101641367 | 7/2016 |
| KR | 101812896 | 12/2017 |
| KR | 1020180018910 | 2/2018 |
| KR | 1020190019863 | 2/2019 |
| WO | 2019171556 | 9/2019 |

OTHER PUBLICATIONS

European Examination Report for Application No. 202049110-1211 dated Sep. 1, 2022 enumerating the above listed reference in the European Examination Report.

Extended European Search Report for Application No. 22166353.7-1211 dated Jul. 19, 2022 enumerating the above isted reference cited in the Extended European Search Report.

ELECTROLUMINESCENT DEVICE AND DISPLAY DEVICE COMPRISING THEREOF

CROSS-REFERENCE TO RELATED APPLICATION

This application claims priority to Korean Patent Application No. 10-2019-0137993 filed on Oct. 31, 2019, and all the benefits accruing therefrom under 35 U.S.C. § 119, the content of which in its entirety is herein incorporated by reference.

BACKGROUND

1. Field

An electroluminescent device and a display device comprising the same are disclosed.

2. Description of the Related Art

A quantum dot ("QD") is a nanocrystal of semiconductor material with a diameter of about several nanometers to several tens of nanometers, which exhibits a quantum confinement effect. The quantum dot generates stronger light in a narrow wavelength region than commonly used phosphors. The quantum dot emits light while the excited electrons are transited from a conduction band to a valence band and wavelengths are changed depending upon a particle size even in the same material. As the quantum dot emits light of a shorter wavelength with a smaller particle size, the quantum dot may provide light in a desirable wavelength region by adjusting the size.

In other words, a light emitting layer including the quantum dot and various types of electronic devices including the same may generally save production costs, compared with an organic light emitting diode using a light emitting layer including a phosphorescent and/or fluorescent material, and desirable colors may be emitted by changing the size of the quantum dot, without using other organic materials in the light emitting layer for emitting other color lights.

Luminous efficiency of the light emitting layer including the quantum dot is determined by quantum efficiency of the quantum dot, a balance of charge carriers, light extraction efficiency, and the like. Particularly, in order to improve the quantum efficiency, excitons may be confined in the light emitting layer, but when the excitons are not confined in the light emitting layer by a variety of factors, it may cause a problem such as exciton quenching.

SUMMARY

An embodiment provides an electroluminescent device having improved luminous efficiency and life-span and a display device including the same.

According to an embodiment, an electroluminescent device includes a first electrode and a second electrode facing each other; and a light emitting layer disposed between the first electrode and the second electrode. Here, the light emitting layer includes a first light emitting layer disposed on the first electrode and including a first quantum dot, and a second light emitting layer disposed the first electrode and including a second quantum dot and an n-type metal oxide.

In an embodiment, the second quantum dot may emit first light in a predetermined wavelength region, and the n-type metal oxide may be included in an amount of greater than about 0 percentages by weight (wt %) and less than or equal to about 20 wt % based on a total weight of the second light emitting layer.

In an embodiment, the n-type metal oxide may include an oxide of a metal including zinc (Zn), magnesium (Mg), tin (Sn) zirconium (Zr), titanium (Ti), aluminum (Al), or a combination thereof.

In an embodiment, the n-type metal oxide may be dispersed in the second light emitting layer.

In an embodiment, the n-type metal oxide may include a hydrophobic organic material attached to at least a portion of a surface of the n-type metal oxide.

In an embodiment, an average particle diameter of the n-type metal oxide may be about 1 nanometers (nm) to about 10 nm.

In an embodiment, the first light emitting layer may further include a p-type semiconductor.

In an embodiment, the p-type semiconductor may include a p-type monomolecular organic semiconductor, a p-type oxide semiconductor, or a combination thereof.

In an embodiment, the p-type semiconductor may be included in an amount of greater than about 0 wt % and less than or equal to about 20 wt % based on a total weight of the first light emitting layer.

In an embodiment, the light emitting layer may have a charge balance factor of greater than about 0.20 and less than about 0.56, which is a ratio (HT/ET) of a hole transport capability (HT) to an electron transport capability (ET).

In an embodiment, the light emitting layer may have a thickness of about 10 nm to about 60 nm.

In an embodiment, at least one of the first quantum dot and the second quantum dot may include a core including a first semiconductor nanocrystal and a shell including a second semiconductor nanocrystal having a composition different from the first semiconductor nanocrystal and disposed on the core.

In an embodiment, a ligand including a moiety derived from metal halide compound, a moiety derived from carboxylic acid-base compound, a moiety derived from thiol compound, or a combination thereof may be attached to at least one of the first quantum dot and the second quantum dot.

In an embodiment, the electroluminescent device may further include a hole transport layer disposed between the first electrode and the light emitting layer.

In an embodiment, the hole transport layer may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine ("TCTA"), N,N'-diphenyl-N,N'-bis(3-methylphenyl)-(1,1'-biphenyl)-4,4'-diamine ("TPD"), N,N'-di(naphthalen-1-yl)-N—N'-diphenyl-benzidine ("NPB"), tris(3-methylphenylphenylamino)-triphenylamine ("m-MTDATA"), poly[N,N'-bis(4-butylphenyl)-N,N'-bis(phenyl)benzidine, NiO, $MoO_3$, or a combination thereof.

In an embodiment, the electroluminescent device may further include an electron transport layer disposed between the second electrode and the light emitting layer.

In an embodiment, the electron transport layer may include an inorganic material nanoparticle, a quinolone compound, a triazine-based compound, a quinoline-based compound, a triazole-based compound, a naphthalene-based compound, or a combination thereof.

In an embodiment, the inorganic material nanoparticle may include a salt of a metal including zinc (Zn), magnesium (Mg), tin (Sn) zirconium (Zr), titanium (Ti), aluminum (Al), or a combination thereof.

In an embodiment, the electroluminescent device may further include a hole transport layer disposed between the first electrode and the first light emitting layer and including an organic material; and an electron transport layer disposed between the second electrode and the second light emitting layer and including an inorganic material. Here, the first light emitting layer may include a p-type organic material.

According to another embodiment, a display device including the electroluminescent device above is provided.

An electroluminescent device having improved luminous efficiency and life-span and a display device including the same are provided.

DETAILED DESCRIPTION

Figure 1:
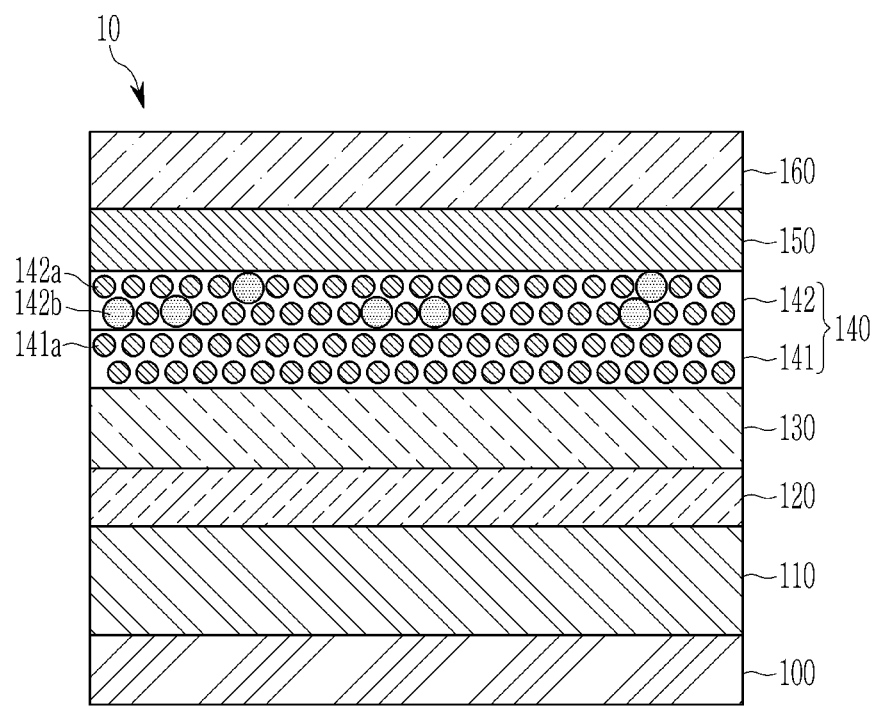
FIG. 1 is a schematic cross-sectional view of an electroluminescent device according to an embodiment, FIG. 2 schematically shows an energy diagram of FIG. 1.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

As used herein, when a definition is not otherwise provided, "thickness" refers to "an average thickness."

The "average thickness" means an arithmetic mean value of thicknesses of measurement objects (e.g., layers, etc.) obtained from scanning electron microscope images at random from several times to several tens of times.

As used herein, for an average diameter of a particle in the present disclosure, although it may be digitized by a measurement to show an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. As used herein, unless particularly mentioning otherwise, an average particle diameter means to a numeral average diameter in the present disclosure, and it is obtained by measuring D50 (particle diameter at a position of distribution rate of 50 percentages (%)).

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example, Zn, Hg, Mg, etc.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

An electroluminescent device including quantum dots (hereinafter referred to as a quantum dot electroluminescent device) are attracting attention as a next generation display device due to high color reproducibility of quantum dots and ease of solution processing.

However, in the quantum dot electroluminescent device, the flow of holes in the light emitting layer including the quantum dots in general is not smooth compared with the flow of electrons in the electric field of a constant intensity. Accordingly, regarding the quantum dot electroluminescent device, an improvement in the following matters is desirable.

For example, charges (e.g., electrons, holes) injected toward the light emitting layer tend to be recombined mainly at the interface between the hole transport layer and the light emitting layer or inside of the hole transport layer and/or the light emitting layer near to the interface. Herein, excitons inside the quantum dot electroluminescent device may be trapped and quenched by several energy levels generated at the interface between the hole transport layer and the light emitting layer and/or in an internal conduction band of the hole transport layer and/or the light emitting layer near to the interface.

Alternatively, the injected electrons and holes may be recombined not in the light emitting layer but in a non-light emitting layer (hole transport layer) and thus form excitons. Herein, the excitons formed in the non-light emitting layer do not contribute to light emission of the device but are quenched and thus may deteriorate efficiency of the quantum dot electroluminescent device.

Alternatively, excess electrons not recombined among the injected electrons and holes are continuously present at the interface between the hole transport layer and the light emitting layer and thus may cause deterioration of materials included in the light emitting layer and/or the hole transport layer. In addition, the excess electrons may cause surface defects of the interface between the hole transport layer and/or the light emitting layer. These surface defects may quench the excitons and in addition, accelerate deterioration of the device, while driven at a constant current.

Accordingly, the present inventors researched on a method of securing a stable hole-electron balance inside the quantum dot electroluminescent device, and thus improving luminous efficiency and life-span characteristics of the device.

As a result, the inventors discovered that when the light emitting layer of the quantum dot electroluminescent device has two or more layers, and when a sublayer of the light emitting layer adjacent to the electron transport layer includes an n-type metal oxide, a stable hole-electron balance within the light emitting layer may be ensured, and a recombination position of electrons and holes may be adjusted from the interface or surroundings of the light emitting layer to the inside of the light emitting layer to achieve improved luminous efficiency and life-span characteristics.

Thus, referring to FIG. 1, a schematic configuration of an electroluminescent device according to an embodiment will be described.

FIG. 1 is a cross-sectional view schematically showing an electroluminescent device according to an embodiment. An electroluminescent device 10 according to an embodiment includes a first electrode 110 and a second electrode 160 facing each other, and a light emitting layer 140 disposed between the first electrode 110 and the second electrode 160.

In an embodiment, the electroluminescent device 10 may further include a hole transport layer 130 disposed between the first electrode 110 and the light emitting layer 140, a hole injection layer 120 that is disposed between the first electrode 110 and the hole transport layer 130, and an electron transport layer 150 disposed between the second electrode 160 and the light emitting layer 140. The hole injection layer 120 may be omitted in consideration of the relationship with each constituent element.

In an embodiment, the light emitting layer 140 is a multi-layer (specifically dual layer) including a first light emitting layer 141 disposed on the hole transport layer 130 and including the first quantum dot 141a and a second light emitting layer 142 disposed on the first light emitting layer 141 and including the second quantum dot 142a and n-type metal oxide 142b.

That is, the electroluminescent device 10 may have a stacked structure in which the hole injection layer 120, the hole transport layer 130, the light emitting layer 140 including the first light emitting layer 141 and the second light emitting layer 142, and the electron transport layer 150 are sequentially stacked between the first electrode 110 and the second electrode 160.

In an embodiment, the first electrode 110 may be directly connected to a driving power source so that the driving power source may function to flow current to the light emitting layer 140. The first electrode 110 may include a material having light transmittance in at least visible light wavelength region, but is not necessarily limited thereto. In another embodiment, the first electrode 110 may include a material having light transmittance in an infrared or ultraviolet ("UV") wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110 according to an embodiment is not necessarily limited thereto. In another embodiment, the first electrode 110 may include a material further having light transmittance regarding light in an infrared or ultraviolet (UV) wavelength region or a semi-permeable material selectively transmitting light in a particular wavelength region and conduct a function of reflecting light in a visible light wavelength region and turning it back toward the second electrode 160.

In an embodiment, the first electrode 110 may be disposed on the substrate 100 as shown in FIG. 1. The substrate 100 may be a transparent insulating substrate or may include or be made of a ductile material. The substrate 100 may include glass or a polymer material in a film having a glass transition temperature (Tg) of greater than about 150 degrees in Celsius (° C.). For example, it includes a cyclo olefin copolymer (COC) or cyclo olefin polymer (COP) based material.

In an embodiment, the substrate 100 may support the hole injection layer 120, the transport layer 130, the light emitting layer 140, and the electron transport layer 150 disposed between the first electrode 110 and the second electrode 160. However, the substrate 100 of the electroluminescent device 10 according to another embodiment may not be disposed under the first electrode 110, but the substrate 100 may be disposed on the second electrode 160 or may be omitted.

The second electrode 160 includes an optically transparent material and may function as a light-transmitting electrode to transmit light generated in the light emitting layer 140. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 160 according to an embodiment is not necessarily limited thereto but may include a semi-permeable material selectively transmitting light in a particular wavelength region, and conduct a function of reflecting light in a visible light wavelength region and turning it back toward the first electrode 110 in another embodiment.

When the second electrode 160 functions as a reflecting electrode, the first electrode 110 may be a light-transmitting electrode including or formed of a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

However, the electroluminescent device 10 according to an embodiment is not necessarily limited thereto but may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed directly on the first electrode 110. The hole injection layer 120 may supply holes into the light emitting layer 140 together with the hole transport layer 130. However, the hole injection layer 120 may be omitted considering the thickness and the material of the hole transport layer 130.

The hole injection layer 120 may be a p-type semiconductor or a material doped with a p-type semiconductor. Examples of the hole injection layer 120 may include poly(3,4-ethylenedioxythiophene) ("PEDOT") or a derivative thereof, poly(styrenesulfonate) ("PSS") or a derivative thereof, poly-N-vinylcarbazole (PVK) or a derivative thereof, polyphenylenevinylene or a derivative thereof, polyparaphenylenevinylene ("PPV") or a derivative thereof, polymethacrylate or a derivative thereof, poly(9,9-dioctylfluorene) or a derivative thereof, poly(spiro-bifluorene) or a derivative thereof, tris(4-carbazolyl-9-yl phenyl)amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine (m-MTDATA), poly[N,N'-bis(4-butylphenyl)-N,N'-bis(phenyl)benzidine, a metal oxide such as NiO or $MoO_3$, or a combination thereof, but is not necessarily limited thereto.

The hole transport layer 130 may be disposed on the first electrode 110, (for example on the first electrode 110 and the hole injection layer 120). The hole transport layer 130 may provide and transport holes into the light emitting layer 140. The hole transport layer 130 may be disposed directly under the light emitting layer 140 (specifically, first light emitting layer 141) to directly contact the light emitting layer 140.

In an embodiment, the hole transport layer 130 may include a material having a hole transporting property. The material having the hole transporting property may be a p-type semiconductor, or a material doped with a p-type semiconductor. The material having the hole transporting property is not limited to a specific material but may be a polymer, an oligomer, a metal oxide, or a combination thereof.

Examples of the material having the hole transporting property may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine (m-MTDATA), poly[N,N'-bis(4-butylphenyl)-N,N'-bis(phenyl)benzidine, NiO, $MoO_3$, or a combination thereof, but is not necessarily limited thereto.

In an embodiment, a thickness of the hole transport layer 130 may be varied in consideration of hole-electron balance with the hole injection layer 120, the hole transport layer 130, and/or the light emitting layer 140 in the electroluminescent device 10. The thickness of the hole transport layer 130 may be, for example, greater than or equal to about 10 nanometers (nm), for example greater than or equal to about 15 nm, or greater than or equal to about 20 nm and, for example, less than or equal to about 80 nm, less than or equal to about 70 nm, less than or equal to about 60 nm, or less than or equal to about 50 nm, for example, about 10 nm to about 80 nm, about 10 nm to about 70 nm, about 10 nm to about 60 nm, about 10 mm to about 50 nm, about 10 nm to about 40 nm, or about 20 nm to about 40 nm.

In another embodiment, for example, the hole transport layer 130 may be formed in a wet coating method such as spin coating and the like. For example, both of the hole transport layer 130 and the light emitting layer 140 (specifically, hole transport layer 130 and the first light emitting layer 141) may be formed in a wet coating method. In this way, the hole transport layer 130 and/or the first light emitting layer 141 may be formed in a simple process.

In addition, in an embodiment, the hole transport layer 130 and the first light emitting layer 141 may include or be made of materials having relatively different solubilities. For example, the hole transport layer 130 may be prepared using a material having excellent solubility for an aromatic non-polar solvent, while the first light emitting layer 141 may be prepared using a material having excellent solubility for an aliphatic non-polar solvent. Accordingly, even though the hole transport layer 130 and the first light emitting layer 141 are directly contacted using a solution process, the first light emitting layer 141 may be formed without surface damage of the hole transport layer 130 due to the different solubilities of the hole transport layer 130 and the first light emitting layer 141.

In another embodiment, for example, when a poly[(9,9-dioctylfluorene-2,7-diyl)-co-(4,4'-(N-4-butylphenyl)diphenylamine)] ("TFB") polymer film is formed as the hole transport layer 130, a precursor solution including a TFB precursor polymer and an aromatic non-polar solvent (e.g., toluene, xylene, etc.) may be spin-coated on the first electrode 110 or the hole injection layer 120, thermal treatment may be performed in an inert gas atmosphere of $N_2$ or in a vacuum at a temperature of about 150° C. to about 180° C. for about 30 minutes to form a hole transport layer 130 made of TFB, and the first light emitting layer 141 may be easily formed thereon using an aliphatic non-polar solvent (for example, octane, nonane, cyclohexane, etc.) using a solution process.

As such, when the hole transport layer 130 and the first light emitting layer 141 is configured to have different relative solubilities, the formation of the hole transport layer 130 and the first light emitting layer 141 using a solution process is more easily performed, and the surface damage of the hole transport layer 130 by organic solvents may be minimized during the subsequent formation of the first light emitting layer 141.

The light emitting layer 140 may be disposed on the hole transport layer 130 and includes a quantum dot. In an embodiment, the light emitting layer 140 includes the first light emitting layer 141 and the second light emitting layer 142 as described above. In an embodiment, each of the first light emitting layer 141 and the second light emitting layer 142 includes a quantum dot. Hereinafter, the quantum dot included in the first light emitting layer 141 is referred to as a first quantum dot 141a, and the quantum dot included in the second light emitting layer 142 is referred to as a second quantum dot 142a.

The light emitting layer 140 is a site where electrons and holes transported by a current supplied from the first electrode 110 and the second electrode 160. The electrons and holes are combined in the light emitting layer 140 to generate excitons, and the generated excitons are transited from an exited state to a ground state to emit light in a wavelength corresponding to the size of the quantum dot. That is, the quantum dot may endow the light emitting layer 140 with an electroluminescence function.

Particularly, the quantum dot has a discontinuous energy bandgap by the quantum confinement effect, and incident light may be converted into light having a particular wavelength and then radiated by the quantum dot. Accordingly, the light emitting layer 140 including the quantum dot may produce light having excellent color reproducibility and color purity (e.g., the light produced by the quantum dot has a narrow range of wavelengths.).

In an embodiment, the light emitting layer 140 may emit light belonging to a predetermined wavelength region by the quantum dot. In an embodiment, each of the first light emitting layer 141 and the second light emitting layer 142 may emit first light belonging to predetermined wavelength regions, respectively. In an embodiment, the light emitted by the first and second light emitting layers 141 and 142 may be light belonging to the same wavelength region. That is, each of the first quantum dot 141a and the second quantum dot 142a may emit first light belonging to the same wavelength region. In an embodiment, the first light may be a wavelength region belonging to a visible light region, for example, one of a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, and a fifth wavelength region of about 620 nm to about 680 nm.

In an embodiment, each of the first quantum dot 141a and the second quantum dot 142a may emit blue light belonging to a first wavelength region of about 380 nm to about 488 nm. In this case, the light emitting layer 140 may be a light emitting layer configured to emit blue light.

In an embodiment, each of the first quantum dot 141a and the second quantum dot 142a may emit red light belonging to a fifth wavelength region of about 620 nm to about 680 nm. In this case, the light emitting layer 140 may be a light emitting layer configured to emit red light.

In an embodiment, materials of the first and second quantum dots 141a and 142a are not particularly limited, and known or commercially available quantum dots may be used.

In an embodiment, at least one of the first quantum dot 141a or the second quantum dot 142a may include a core including a first semiconductor nanocrystal and a shell including a second semiconductor nanocrystal which is disposed on the core, and the second semiconductor nanocrystal may have a composition different from the first semiconductor nanocrystal. That is, only one of the first quantum dot 141a and the second quantum dot 142a may have the core-shell structure, or both of the first quantum dot 141a and the second quantum dot 142a may have the core-shell structure.

In an embodiment, the interface between the core and the shell may have a concentration gradient where a concentration of element(s) in the shell decreases toward the center. In an embodiment, the quantum dot may have a structure (e.g., core-single shell structure) including one core and one layer of shell surrounding it. In this case, the single shell structure may have a single composition or concentration gradient.

However, an embodiment is not necessarily limited thereto. In another embodiment, at least one of the first quantum dot 141a and the second quantum dot 142a may have a structure including one core and a multi-layered shell surrounding the core. Herein, the multi-layered shell structure has a structure of two or more shells and each layer may have a single composition or an alloy or may have a concentration gradient.

As such, when at least one of the first quantum dot 141a and the second quantum dot 142a has a core-shell structure, a material composition constituting the shell may have a larger bandgap energy than that of the core, and, thus, the shell has a structure in which the quantum confinement effect is effectively exhibited. However, an embodiment is not necessarily limited thereto. On the other hand, even in the case of a multi-layered shell, an outermost shell may have a larger bandgap energy than the shell close to the core. In this case, the quantum dot(s) having a core-multi-layered shell structure among the first quantum dot 141a and the second quantum dot 142a may emit light in an ultraviolet (UV) to infrared wavelength range.

In an embodiment, the first semiconductor nanocrystal included in the core and the second semiconductor nanocrystal included in the shell may independently include a Group II-VI compound that does not include Cd, a Group III-V compound, a Group IV-VI compound, a Group IV element or compound, a Group compound, a Group I-II-IV-VI compound that does not include Cd, or a combination thereof. That is, each of the first and second quantum dots 141a and 142a may be a cadmium-free quantum dot. Like this, when the first and second quantum dots 141a and 142a consist of cadmium-free materials, they have no toxicity compared with a conventional cadmium-based quantum dots and thus are not dangerous and are environmentally-friendly.

The Group II-VI compound may be selected from a binary element compound selected from ZnS, ZnSe, ZnTe, ZnO, HgS, HgSe, HgTe, MgSe, MgS, or a mixture thereof; a ternary element compound selected from ZnSeS, ZnSeTe, ZnSTe, HgSeS, HgSeTe, HgSTe, HgZnS, HgZnSe, HgZnTe, MgZnSe, MgZnS, or a mixture thereof; or a quaternary element compound selected from HgZnTeS, HgZnSeS, HgZnSeTe, HgZnSTe, or a mixture thereof. The Group II-VI compound may further include a Group III metal.

The Group III-V compound may be selected from a binary element compound selected from GaN, GaP, GaAs, GaSb, AlN, AlP, AlAs, AlSb, InN, InP, InAs, InSb, or a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be selected from a binary element compound selected from SnS, SnSe, SnTe, PbS, PbSe, PbTe, or a mixture thereof; a ternary element compound selected from SnSeS, SnSeTe, SnSTe, PbSeS, PbSeTe, PbSTe, SnPbS, SnPbSe, SnPbTe, or a mixture thereof; or a quaternary element compound selected from SnPbSSe, SnPbSeTe, SnPbSTe, or a mixture thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, but are not limited thereto. Examples of the Group IV compound may be a single substance selected from Si, Ge, or a mixture thereof; or a binary element compound selected from SiC, SiGe, or a mixture thereof.

The binary element compound, the ternary element compound, or the quaternary element compound respectively exists in a uniform concentration in the particle or in partially different concentrations in the same particle.

The first and second quantum dots 141a and 142a may have independently quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the first and second quantum dots 141a and 142a may have a relatively narrow emission wavelength spectrum so as to improve color purity or color reproducibility. The first and second quantum dots 141a and 142a may have independently a full width at half maximum ("FWHM") of an emission wavelength spectrum of, for example, less than or equal to about 45 nm, less than or equal to about 40 nm, or less than or equal to or about 30 nm. Within the ranges, color purity or color reproducibility of a device may be improved.

The first and second quantum dots 141a and 142a may independently have a particle diameter (the longest size for a non-spherically shaped particle) of about 1 nm to about 100 nm. For example, the first and second quantum dots 141a and 142a may independently have a particle diameter (the longest size for a non-spherically shaped particle) of, for example, about 1 nm to about 20 nm, about 1 nm to about 15 nm, about 1 nm to about 14 nm, about 1 nm to about 13 nm, about 1 nm to about 12 nm, about 1 nm to about 11 nm, or about 1 nm to about 10 nm.

In addition, the shapes of the first and second quantum dots 141a and 142a may be general shapes in this art and thus may not be particularly limited. For example, the quantum dots may have a spherical, oval, tetrahedral, pyramidal, cuboctahedral, cylinderical, polyhedral, multi-armed, or cube nanoparticle, nanotube, nanowire, nanofiber, nanosheet, or a combination thereof. The quantum dots may have any cross-sectional shape.

The first and second quantum dots 141a and 142a may be commercially available or may be synthesized in any method. For example, several nanometer-sized quantum dots may be synthesized according to a wet chemical process. In the wet chemical process, precursors react in an organic solvent to grow crystal particles, and the organic solvent or surfactants for forming ligands may coordinate the surface of the quantum dot, controlling the growth of the crystal. Examples of the organic solvent and the surfactants for forming ligands are known.

The organic solvent and the surfactants for forming ligands may be selected appropriately. Examples of the organic solvent may include C6 to C22 primary amine such as hexanedecylamine; C6 to C22 secondary amine such as dioctylamine; C6 to C40 tertiary amine such as trioctylamine; nitrogen-containing heterocyclic compounds such as pyridine; C6 to C40 olefin such as octadecene; C6 to C40 aliphatic hydrocarbon such as hexane, octane, hexanedecane, octadecane, or squalane; aromatic hydrocarbon substituted with a C6 to C30 alkyl group such as phenyldodecane, phenyltetradecane, or phenyl hexanedecane; primary, secondary, or tertiary phosphine (e.g., trioctylphosphine) substituted with at least one (e.g., 1, 2, or 3) C6 to C22 alkyl group; phosphine oxide (e.g. trioctylphosphineoxide) substituted with at least one (e.g., 1, 2, or 3) C6 to C22 alkyl group; C12 to C22 aromatic ether such as phenyl ether, benzyl ether; or a combination thereof.

Examples of the surfactants for forming ligands may include $RCOOH$, $RNH_2$, $R_2NH$, $R_3N$, $RSH$, $RH_2PO$, $R_2HPO$, $R_3PO$, $RH_2P$, $R_2HP$, $R_3P$, ROH, RCOOR', RPO(OH)$_2$, RHPOOH, RHPOOH (Here, R and R' are independently hydrogen, a C1 to C40 substituted or unsubstituted aliphatic hydrocarbon, or C6 to C40 substituted or unsubstituted aromatic hydrocarbon, or a combination thereof, and in each ligand, at least one R is not hydrogen), or a combination thereof, but are not limited thereto.

Since organic solvents coordinated to the surfaces of the quantum dots may affect stability in the device, excess materials (organic solvents, surfactants for forming ligands, or combinations thereof) that are not coordinated to the surface of the nanocrystals may be removed by excessively pouring them into a non-solvent and centrifuging the resultant mixture. Specific examples of the non-solvent include, but are not limited to, acetone, ethanol, and methanol. After removing excess material, the amount of materials coordinated to the surfaces of the quantum dots may be less than or equal to about 50 wt %, for example, less than or equal to about 30 wt %, less than or equal to about 20 wt %, or less than or equal to about 10 wt % of the weight of the quantum dots. The materials coordinated to the surfaces of the quantum dots may include ligands, organic solvents, or a combination thereof. The materials coordinated to the surfaces of the quantum dots, specifically the ligands, may impart dispersibility to the quantum dots.

In an embodiment, at least a portion of the surfaces of the first and second quantum dots 141a and 142a may have ligands attached thereto. In an embodiment, examples of the ligand may be a moiety derived from a metal halide compound, a moiety derived from a carboxylic acid-base compound, a moiety derived from thiol compound, or a combination thereof.

In an embodiment, the ligand may be a ligand (hereinafter, referred to as a hydrophobic ligand) having a hydrophobic moiety. In an embodiment, the hydrophobic ligand may include a moiety chemically bound to the surface of the quantum dots and a hydrophobic functional group providing hydrophobicity. In an embodiment, examples of the hydrophobic ligand may be a moiety derived from a carboxylic acid-base compound, a moiety derived from thiol compound, or a combination thereof.

Examples of the hydrophobic moiety may include a C4 to C20 alkyl group, a C4 to C20 alkenyl group, a C4 to C20 alkynyl group, or a combination thereof, and examples of the moiety that forms a bond with the surface of the quantum dot may be a carboxylate (—COO$^-$) moiety, a thiolate (—SH$^-$) moiety, and the like.

In an embodiment, examples of the moiety derived from carboxylic acid-base compounds may include a moiety derived from fatty acid such as oleate, stearate, palmitate, and the like. In an embodiment, examples of the compound derived from the thiol may include C6 to C20 aliphatic thiolate.

For example, when the first quantum dot 141a has a hydrophobic ligand as described above, the first light emitting layer 141 including the same may also exhibit nonpolarity as a whole. In addition, the first quantum dot to which the hydrophobic ligand is attached has solvent selectivity with respect to a nonpolar solvent, specifically an aliphatic nonpolar solvent. Accordingly, even if the first light emitting layer 141 is formed on the hole transport layer 130 having solvent selectivity for the aromatic nonpolar solvent by using a solution process, damage to the surface of the hole transport layer 130 by an organic solvent during the formation of the first light emitting layer 141 may be minimized.

However, an embodiment is not limited thereto. The second quantum dot 142a may have the aforementioned hydrophobic ligand, and neither of the first and second quantum dots 141a and 142a may have the aforementioned hydrophobic ligand.

For example, at least one surface of the first and second quantum dots 141a and 142a may have a ligand having a lower solubility in an organic solvent than a quantum dot having the aforementioned hydrophobic ligand attached thereto. In this case, examples of the ligand may include a moiety derived from a metal halide compound.

The metal halide compound may include zinc, indium, gallium, magnesium, lithium, or a combination thereof and/or may be in a form of chloride, bromide, iodide, or fluoride. The metal included in the metal halide compound may be the same as the metal included in the outermost layer of the quantum dots, or may be different from each other.

Specific examples of metal halide compound may be zinc fluoride, zinc chloride, zinc bromide, zinc iodide, indium fluoride, indium chloride, indium bromide, indium iodide, gallium fluoride, gallium chloride, gallium bromide, gallium iodide, magnesium fluoride, magnesium chloride, magnesium bromide, magnesium iodide, lithium fluoride, a lithium chloride, lithium bromide, lithium iodide, or a combination thereof.

The moiety derived from the metal halide compound may include a moiety that is chemically bound to the surface of the attached quantum dot. Examples of the moiety that forms a bond on the surface of the quantum dot may include a halogen ion moiety (e.g., $F^-$, $Cl^-$, $Br^-$, $I^-$). The halogen ion moiety may be strongly bound to the surface of the quantum dots and may passivate the quantum dots (e.g., in place of them) instead of other ligands (e.g., hydrophobic ligands such as oleic acid, etc.) present on the surface of the quantum dots.

The moiety derived from the metal halide compound may be obtained by reacting a metal halide compound solution on the light emitting layer including quantum dots to which the aforementioned hydrophobic ligand is attached. At least a portion of the hydrophobic ligands attached to the quantum dots may be replaced by the aforementioned halogen ion moiety. A ratio of the hydrophobic ligand attached to the surface of the quantum dots and the moiety derived from the metal halide compound may be variously controlled by adjusting a concentration of the metal halide compound solution, a reaction time, and the like.

While not wishing to be bound by any theory, the aforementioned hydrophobic ligand may reduce luminous efficiency of quantum dots because the hydrophobic moiety generally acts as a barrier against electron and hole injection. However, in an embodiment, the quantum dots having the attached moiety derived from the metal halide compound may provide improved passivation as well as improved charge injection characteristics compared with the quantum dots having attached the hydrophobic ligand.

In an embodiment, a thickness of the light emitting layer 140, specifically a sum thickness of the first and second light emitting layers 141 and 142 may be varied depending on types and sizes of the first and second quantum dots included in each of the first and second light emitting layers 141 and 142, and types of ligands attached thereto. However, it may be, for example, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm. The light emitting layer 140 may include two or more monolayers, for example, three or more layers, or four or more layers of the quantum dots. The thickness of the light emitting layer 140 may be less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm. The thickness of the light emitting layer 140 may be, for example, about 10 nm to about 60 nm, about 15 nm to about 60 nm, about 20 nm to about 60 nm, about 25 nm to about 60 nm, or about 25 nm to about 50 nm.

The electroluminescent device 10 according to an embodiment may include quantum dots in a predetermined amount to improve luminous efficiency of the light emitting layer 140.

In an embodiment, for example, a total weight of the first and second quantum dots 141a and 142a may be included in an amount of, for example, greater than or equal to about 5 wt %, greater than or equal to about 10 wt %, greater than or equal to about 15 wt %, or greater than or equal to about 20 wt %, and less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, for example, about 5 wt % to about 98 wt %, about 20 wt % to about 98 wt %, about 20 wt % to about 90 wt %, about 20 wt % to about 85 wt %, about 50 wt % to about 85 wt %, or about 50 wt % to about 80 wt % based on 100 wt % of the light emitting layer 140.

However, an embodiment is not necessarily limited thereto. A sum amount of the first and second quantum dots 141a and 142a in the light emitting layer 140 may be varied depending on amounts of other constituent elements in the light emitting layer 140, types and/or amounts of used ligands, materials of the first and second quantum dots 141a and 142a, wavelength ranges of emitted light, thicknesses of the electron transport layer 130, the light emitting layer 140, and/or the electron transport layer 150, and the like.

In an embodiment, the first light emitting layer 141 may include the first quantum dot 141a described above. The first light emitting layer 141 may provide holes received from the adjacent hole transport layer 130 to the second light emitting layer 142, and the holes are recombined with electrons to emit light in a predetermined wavelength region using the first quantum dot 141a.

In addition, the first light emitting layer 141 functions as a space in which holes received from the hole transport layer 130 are not supplied to the second light emitting layer 142. That is, as the hole-electron recombination in the second light emitting layer 142 is suppressed, electrons reaching the first light emitting layer 141 may be increased. As a result, the electron-hole recombination may function to be concentrated inside the light emitting layer, specifically, inside the first light emitting layer, rather than an interface between the light emitting layer and the hole transport layer. More details on these will be described later with descriptions for the second light emitting layer 142.

In an embodiment, a moiety derived from the metal halide compound described above may be attached to the first quantum dot 141a. In an embodiment, greater than or equal to about 10%, for example, 20%, greater than or equal to about 30%, greater than or equal to about 40%, greater than or equal to about 50%, greater than or equal to about 60%, greater than or equal to about 70%, greater than or equal to about 80%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, or greater than or equal to about 98% of the ligands that are attached to the surface of the first quantum dot 141a may be the moiety derived from the metal halide compound. When a ratio of the moiety derived from the metal halide compound attached to the surface of the first quantum dot 141a satisfies the above range, the first light emitting layer 141 may exhibit low solubility in an organic solvent. As a result, even if the second light emitting layer 142 is formed by using a solution process directly on the first light emitting layer 141, damage to the first light emitting layer 141 may be minimized.

However, an embodiment is not necessarily limited thereto, and the types and/or ratios of the ligand attached to the surface of the first quantum dot 141a may be varied depending on the presence or absence, types, and/or ratios of the ligands attached to the surface of the second quantum dot 142a.

The second light emitting layer 142 is disposed directly on the first light emitting layer 141 and may include the second quantum dot 142a and the n-type metal oxide 142b. The second light emitting layer 142 may provide electrons received from the adjacent electron transport layer 150 to the first light emitting layer 141, and the electrons are recombined with holes to emit light in a predetermined wavelength region by using the second quantum dot 142a.

In an embodiment, the first light emitting layer 141 and the second light emitting layer 142 may be separate layers that are distinguished from each other. For example, the first light emitting layer 141 and the second light emitting layer 142 may be distinguished by types of the first quantum dot 141a and the second quantum dot 142a, types of the attached ligands, and the like. The first light emitting layer 141 and the second light emitting layer 142 may be distinguished by amounts of the n-type metal oxide 142b, or may be distinguished by the electron-hole recombination position.

Figure 2:
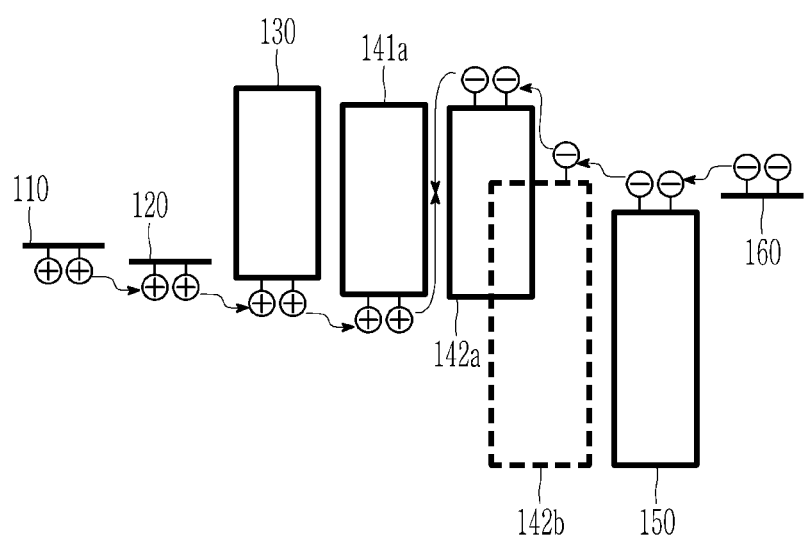

FIG. 2 schematically shows an energy diagram of FIG. 1.

Referring to FIG. 2, in an embodiment, the n-type metal oxide 142b included in the second light emitting layer 142 may have electron transfer characteristics and/or hole block characteristics. Accordingly, the second light emitting layer 142 may exhibit improved electron transport properties, and/or may act as an energy barrier for the movement of holes from the first light emitting layer 141 to the second light emitting layer 142.

Specifically, an absolute value of the Lowest Unoccupied Molecular Orbital (LUMO) energy level of the n-type metal oxide 142b may be varied depending on materials constituting the electron transport layer 150, materials of the second quantum dot 142a, and the like. However, it may be equal to or smaller than an absolute value of the LUMO energy level of the electron transport layer 150, and may be equal to or greater than an absolute value of the LUMO energy level of the second quantum dot 142a. Accordingly, the n-type metal oxide 142b may lower the energy required for electrons supplied to the second light emitting layer 142 to move inside the second light emitting layer 142.

On the other hand, an absolute value of the Highest Occupied Molecular Orbital (HOMO) energy level of the n-type metal oxide 142b may be equal to or greater than an absolute value of the HOMO energy level of the second quantum dot 142a. Accordingly, the n-type metal oxide 142b may adjust holes in the first light emitting layer 141 not to be easily transferred to the second light emitting layer 142 and to stay in the first light emitting layer 141.

As a result, the electroluminescent device 10 according to an embodiment of the present disclosure may adjust recombination positions of holes and electrons to be inside the light emitting layer 140, specifically, at the interface between the first light emitting layer 141 and the second light emitting layer 142 and/or near the interface, as shown in FIG. 2.

As the content of the n-type metal oxide 142b included in the second light emitting layer 142 increases, the hole blocking property of the second light emitting layer 142 may increase proportionally. Even if the second quantum dot 142a and the n-type metal oxide 142b are mixed in the second light emitting layer 142, the energy bands of the second quantum dots 142a and the n-type metal oxide 142b are independently maintained. Accordingly, the hole blocking property of the second light emitting layer 142 may be enhanced.

In this case, the electroluminescence device 10 may not include the electron transport layer 150. Through the second light emitting layer 142 including the n-type metal oxide 142b, the leakage current of the electroluminescent device 10 may be reduced, and luminous efficiency may be improved. Further, the manufacturing process of the electroluminescence device 10 may be simplified by not forming the electron transport layer 150.

In an embodiment, the n-type metal oxide 142b is not particularly limited as long as it has electron transfer characteristics and/or hole block characteristics. Examples of the n-type metal oxide 142b may include an oxide of a metal including zinc (Zn), magnesium (Mg), tin (Sn) zirconium (Zr), titanium (Ti), aluminum (Al), or combinations thereof.

In an embodiment, the n-type metal oxide 142b may include a compound represented by Chemical Formula 1:

$$Zn_{1-x}M_xO \quad \text{Chemical Formula 1}$$

In Chemical Formula 1, M is Mg, Sn, Ca, Zr, W, Li, Ti, Y, Al, or a combination thereof, and $0 \le x \le 0.5$.

In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.15.

In an embodiment, the n-type metal oxide 142b may be dispersed in the second light emitting layer 142. In an embodiment, the n-type metal oxide 142b may include particles ranging in size from several nanometers to tens of nanometers An average particle diameter of the n-type metal oxide 142b may be varied depending on sizes of the second quantum dot 142a in the second light emitting layer 142, a target thickness of the second light emitting layer 142, and the like, but may be, for example, greater than or equal to about 1 nm, greater than or equal to about 2 nm, or greater than or equal to about 3 nm and, for example, less than or equal to about 10 nm, less than or equal to about 9 nm, less than or equal to about 8 nm, less than or equal to about 7 nm, less than or equal to about 6 nm, or less than or equal to about 5 nm, or, for example, about 1 nm to about 10 nm, about 1 nm to about 5 nm, or about 2 nm to about 5 nm.

In order to improve dispersibility inside the second light emitting layer 142, the n-type metal oxide 142b may have a hydrophobic organic material attached to at least a portion of the surface thereof. For example, the hydrophobic organic material may be coordinated to the surface of the n-type metal oxide 142b.

Examples of the hydrophobic organic material may include C6 to C40 aliphatic hydrocarbons such as hexane, octane, hexadecane, octadecane, squalane; C6 to C20 carboxylic acid-based compounds such as oleate, stearate, or palmitate, and the like.

In this case, since the n-type metal oxide 142b is generally hydrophobic by the hydrophobic organic material, the n-type metal oxide 142b may have improved dispersibility for the hydrophobic organic solvent together with the second quantum dot 142a to which the hydrophobic ligand is attached.

Even if the hydrophobic organic material is attached to the n-type metal oxide 142b, the resistance increased by the hydrophobic organic material is insignificant or has no effect, compared with the n-type metal oxide having no the hydrophobic organic material attached to the surface of the n-type metal oxide. In other words, even if the hydrophobic organic material is attached to the n-type metal oxide 142b, electron transport characteristics and/or hole blocking characteristics of the n-type metal oxide are not significantly deteriorated.

In an embodiment, for example, when ZnO is used as the n-type metal oxide, the electrical conductivity of ZnO having no attached hydrophobic organic material is about $2.2 \times 10^{-5}$ Siemens per centimeter (S/Cm), and the electrical conductivity of ZnO having attached hexane is about $5.1 \times 10^{-4}$ S/Cm; and when the ZnMgO is used as the n-type metal oxide, the electrical conductivity of ZnMgO having no attached hydrophobic organic material is about $2.4 \times 10^{-9}$ S/Cm, and electrical conductivity of ZnMgO having attached hexane is about $5.6 \times 10^{-9}$ S/Cm.

However, an embodiment is not necessarily limited thereto, but may use an n-type metal oxide having no attached hydrophobic organic material on the surface, or may use a mixture of the n-type metal oxide having the attached hydrophobic organic material on the surface and the n-type metal oxide having no attached hydrophobic organic material on the surface.

In an embodiment, a content of the n-type metal oxide 142b may be varied depending on a wavelength of light emitted from the second light emitting layer 142, but may be, for example, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 12% weight, less than or equal to about 11 wt %, less than or equal to about 10.5 wt %, or less than or equal to about 10 wt % and, for example, greater than about 0 wt %, greater than or equal to about 1 wt %, greater than or equal to about 2 wt %, or greater than or equal to about 3 wt %, or, for example, greater than about 0 wt % and less than or equal to about 20 wt %, greater than about 0 wt % and less than or equal to about 15 wt %, about 1 wt % to about 11 wt %, or about 2 wt % to about 11 wt % based on a total weight of the second light emitting layer 142 so that the second light emitting layer 142 may exhibit the aforementioned electron transfer characteristics and/or hole block characteristics. For example, when the second light emitting layer 142 emits a blue light (i.e., comprising quantum dots emitting a blue light), the content of the n-type metal oxide 142b may be greater than about 0 wt % to about 12 wt %, about 1 wt % to about 11 wt %, about 2 wt % to about 11 wt %, or about 3 wt % to about 10 wt % based on a total weight of the second light emitting layer 142. When the second light emitting layer 142 emits a red light (i.e., comprising quantum dots emitting a red light), the content of the n-type metal oxide 142b may be greater than about 0 wt % to about 20 wt %, about 1 wt % to about 17 wt %, or about 3 wt % to about 15 wt % based on a total weight of the second light emitting layer 142.

The light emitting layer 140 is a multi-layer of the first, second light emitting layers 141 and 142, where the position of recombining electron-hole is controlled onto an interface between the first and second light emitting layers 141 and 142 by ensuring electron-hole balance through an n-type metal oxide 142b included in the second light emitting layer 142, so that the electroluminescent device 10 including the same may show improved luminous efficiency and life-span characteristics.

In an embodiment, each of the first and second light emitting layers 141 and 142 may include at least one or more monolayers, for example, at least 1.5 or more layers of at least quantum dots.

A thickness of each of the first and second light emitting layers 141 and 142 may be varied depending on materials of the first and second quantum dots 141a and 142a, types of the ligands, and amounts of other constituent elements of each light emitting layer, but may be, for example, less than or equal to about 50 nm, less than or equal to about 40 nm, less than or equal to about 30 nm, or less than or equal to about 20 nm and, for example, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm, or, for example, about 5 nm to about 50 nm, about 5 nm to about 40 nm, about 5 nm to about 30 nm, or about 10 nm to about 30 nm.

In an embodiment, each of the first and second light emitting layers 141 and 142 may have a different range of thicknesses. For example, the first light emitting layer 141 may have a thickness of about 20 nm to about 40 nm, about 20 nm to about 35 nm, about 25 nm to about 35 nm, or about 25 nm to about 30 nm and the second light emitting layer 142 may have a thickness of about 5 nm to about 20 nm, about 5 nm to about 15 nm, or about 10 nm to about 15 nm.

In an embodiment, the electron transport layer 150 may be disposed between the light emitting layer 140 and the second electrode 160 and specifically directly on the second light emitting layer 142 to transport electrons to the light emitting layer 140.

In an embodiment, a thickness of the electron transport layer 150 may be varied in consideration of an electron-hole balance with the hole injection layer 120, the hole transport layer 130, and/or the light emitting layer 140 in the device, but may be, for example, greater than or equal to about 10 nm, greater than or equal to about 15 nm, or greater than or equal to about 20 nm, and, for example, less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm, or, for example, about 10 nm to about 100 nm, about 10 nm to about 60 nm, about 10 nm to about 50 nm, about 10 mm to about 40 nm, or about 15 nm to about 40 nm.

When the electron transport layer 150 has a thickness out of the above range, the void, the crack, and the like on the electron transport layer 150 have a more influence on electron transport properties and thus greatly deteriorate device characteristics and hardly accomplish an electron-hole balance with the other constituent elements in the electroluminescent device 10.

In an embodiment, the electron transport layer 150 may include or be formed of an electron-transporting material not emitting light by an electric field and thus not internally quenching electrons.

The electron transport layer 150 may include inorganic material nanoparticles or may be an organic layer formed by deposition. For example, the electron transport layer 150 may include inorganic material nanoparticles, a quinolone-based compound, a triazine-based compound, a quinoline-based compound, a triazole-based compound, a naphthalene-based compound, or a combination thereof.

In an embodiment, the electron transport layer 150 may include inorganic material nanoparticles. The inorganic material nanoparticles may impart electron transport properties to the electron transport layer 150 and do not exhibit light emitting properties. Examples of the inorganic material nanoparticles may be salts of metals including zinc (Zn), magnesium (Mg), tin (Sn), zirconium (Zr), titanium (Ti), aluminum (Al), or a combination thereof. The inorganic material nanoparticles may include or be made of the same material as the aforementioned n-type metal oxide, or may include or be made of different materials from the aforementioned n-type metal oxide.

In an embodiment, the electron transport layer 150 may include two or more inorganic material nanoparticles. In an embodiment, the electron transport layer 150 may include a cluster layer consisting of a plurality of inorganic material nanoparticles. In an embodiment, the electron transport layer 150 may be a cluster layer consisting of two or more inorganic material nanoparticles.

An electron injection layer to facilitate the injection of electrons and/or a hole blocking layer to prevent the movement of holes (not shown) may be further disposed between the electron transport layer 150 and the second electrode 160.

Thicknesses of the electron injection layer and the hole blocking layer may be selected appropriately. For example, each thickness of the layers may be greater than or equal to about 1 nm or less than or equal to about 500, but is not limited thereto. The electron injection layer may be an organic layer formed by deposition.

The electron injection layer may include, for example, at least one selected from 1,4,5,8-naphthalene-tetracarboxylic dianhydride ("NTCDA"), bathocuproine ("BCP"), tris[3-(3-pyridyl)-mesityl]borane ("3TPYMB"), LiF, Alq$_3$, Gaq$_3$, Inq$_3$, Znq$_2$, Zn("BTZ")$_2$, BeBq$_2$, ET204 (8-(4-(4,6-di(naphthalen-2-yl)-1,3,5-triazin-2-yl)phenyl)quinolone), 8-hydroxyquinolinato lithium ("Liq"), n-type metal oxide (e.g., ZnO, HfO$_2$, etc.), Bphen, or a combination thereof, but is not limited thereto.

The hole blocking layer may include, for example, at least one selected from 1,4,5,8-naphthalene-tetracarboxylic dianhydride ("NTCDA"), bathocuproine ("BCP"), tris[3-(3-pyridyl)-mesityl]borane ("3TPYMB"), LiF, Alq$_3$, Gaq$_3$, Inq$_3$, Znq$_2$, Zn("BTZ")$_2$, BeBq$_2$, or a combination thereof, but is not limited thereto.

As described above, in the electroluminescent device 10 according to an embodiment, the light emitting layer 140 includes a multi-layer of the first, second light emitting layers 141 and 142, where the electron-hole recombining position may be controlled onto an interface between the first, second light emitting layers 141 and 142 by ensuring the electron-hole balance through the n-type metal oxide 142b included in the second light emitting layer 142. As the result, the electroluminescent device 10 may show improved luminous efficiency and life-span characteristics.

Hereinafter, an electroluminescent device 10' according to another embodiment is described referring to FIGS. 3 to 4. For describing the electroluminescent device 10' according to another embodiment, the detailed descriptions on the same constituent elements as in the electroluminescent device 10 are omitted.

Figure 3:
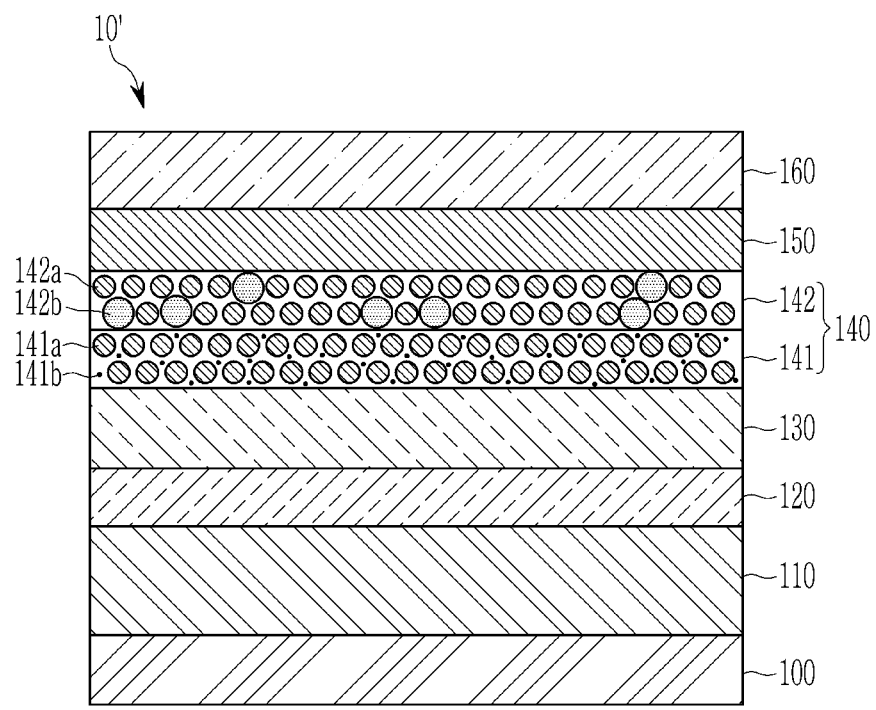
FIG. 3 is a cross-sectional view schematically showing an electroluminescent device according to another embodiment, FIG. 4 schematically shows an energy diagram of FIG. 3.
Figure 4:
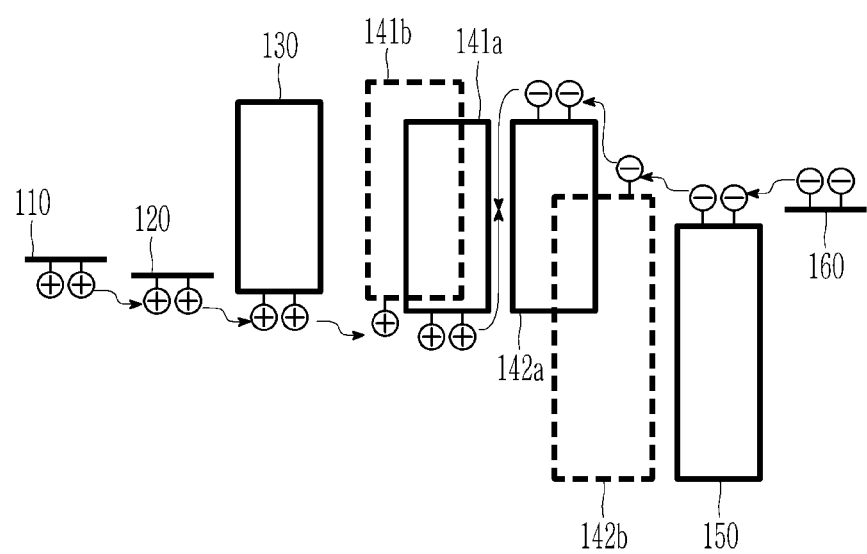

FIG. 3 is a cross-sectional view schematically showing an electroluminescent device according to another embodiment and FIG. 4 schematically shows an energy diagram of FIG. 3.

Referring to FIGS. 3 to 4, the electroluminescent device 10' according to another embodiment has the same constituent elements as in the electroluminescent device 10 according to one embodiment, except that the first light emitting layer 141 further includes a p-type semiconductor 141b besides the first quantum dots 141a.

In another embodiment, the p-type semiconductor 141b included in the first light emitting layer 141 is not particularly limited as long as it has hole transfer characteristics and/or electron block characteristics.

In another embodiment, examples of the p-type semiconductor 141b may include a p-type monomolecular organic semiconductor, a p-type oxide semiconductor, or a combination thereof.

Examples of the p-type monomolecular organic semiconductor may be tris(4-carbazol-9-yl phenyl)amine (TCTA), N,N'-diphenyl-N,N'-bis(3-methylphenyl)-(1,1'-biphenyl)-4,4'-diamine (TPD), N,N'-bis(3-methylphenyl)-N,N'-bis(phenyl)-2,7-diamino-9,9-spirobifluorene (spiro-TPD), N,N'-bis(3-methylphenyl)-N,N'-bis(phenyl)-9,9-dioctylfluorene ("DOFL-TPD"), N,N'-di(naphthalen-1-yl)-N—N'-diphenylbenzidine (NPB), N2,N7-di(naphthalen-1-yl)-9,9-dioctyl-N2,N7-diphenyl-9H-fluorene-2,7-diamine (DOFL-NPB), tris(3-methylphenylphenylamino)-triphenylamine (m-MTDATA), dipyrazino[2,3-f:2',3'-h]quinoxaline-2,3,6,7,10,11-hexacarbonitrile ("HAT-CN"), di-[4-(N,N-di-p-tolyl-amino)-phenyl]cyclohexane ("TAPC"), N,N'-(4,4'-(cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 4,4'-bis(N-carbazolyl)-1,1'-biphenyl ("CBP"), 2,6-bis (3-(9H-carbazol-9-yl)phenyl)pyridine (26DCzPPy), or a combination thereof.

Examples of the p-type oxide semiconductor may include an oxide including a material including vanadium (V), molybdenum (MO), nickel (Ni), copper (Cu), chromium (Cr), graphene, or a combination thereof.

In an embodiment, the p-type semiconductor 141b may be, for example, in an amount of, for example, less than or equal to about 20 wt %, less than or equal to about 15 wt %, less than or equal to about 14% weight, less than or equal to about 13% weight, less than or equal to about 12% weight, less than or equal to about 11 wt %, or less than or equal to about 10 wt %, and, for example, greater than 0 wt %, greater than or equal to about 1 wt %, greater than or equal to about 2 wt %, or greater than or equal to about 3 wt %, or, for example, greater than about 0 wt % and less than or equal to about 20 wt %, greater than about 0 wt % and less than or equal to about 15 wt %, greater than about 0 wt % and less than or equal to about 12 wt %, greater than about 0 wt % and less than or equal to about 11 wt %, about 1 wt % to about 11 wt %, or about 2 wt % to about 11 wt % based on a total weight of the first light emitting layer 141 so that the first light emitting layer 141 may exhibit the aforementioned hole transfer characteristics and/or electron block characteristics.

According to another embodiment, although it may be different depending upon the material for the hole transport layer 130, the material for the first quantum dots 141a, or the like, an absolute value of the LUMO (Lowest Unoccupied Molecular Orbital) energy level of the p-type semiconductor 141b may be equal to or lower than an absolute value of the LUMO energy level of the hole transport layer 130, and may be same as or less than the absolute value of the LUMO energy level of the first quantum dots 141a. Thereby, the p-type semiconductor 141b may lower energy required to transfer hole supplied to the first light emitting layer 141 in the first light emitting layer 141.

On the other hand, an absolute value of the HOMO (Highest Occupied Molecular Orbital) energy level of the p-type semiconductor 141b may be equal to or lower than an absolute value of the HOMO energy level of the second quantum dot 142a. Accordingly, the p-type semiconductor 141b may adjust electrons in the second light emitting layer 142 not to be easily transferred to the first light emitting layer 141 and to stay in the second light emitting layer 142.

As a result, the electroluminescent device 10' according to another embodiment may adjust recombination positions of holes and electrons to be inside the light emitting layer 140, specifically, at the interface between the first light emitting layer 141 and the second light emitting layer 142 and/or near the interface, as shown in FIG. 4. That is, the electroluminescent device 10' according to another embodiment may be configured to form a p-n junction of the first light emitting layer 141 including the p-type semiconductor 141b and the second light emitting layer 142 including the n-type metal oxide 142b, and thus the electron-hole recombination position may be adjusted to be at an interface between the first and second light emitting layers 141 and 142.

In addition, as the content of the p-type semiconductor 141b included in the first light emitting layer 141 increases, the electron blocking property of the first light emitting layer 141 may increase proportionally. Even if the first quantum dot 141a and the p-type semiconductor 141b are mixed in the first light emitting layer 141, the energy bands of the first quantum dots 141a and the p-type semiconductor 141b are independently maintained. Accordingly, the electron blocking property of the first light emitting layer 141 may be enhanced.

In this case, the electroluminescence device 10 may not include the hole transport layer 130. Even if the electroluminescent device 10 does not include the hole transport layer 130, the first light emitting layer 141 including the p-type semiconductor 141b may replace the hole transport layer 130.

As reviewed above, the electroluminescent device 10, 10' is formed by including the first, second light emitting layers 141, where the second light emitting layer 142 includes at least n-type metal oxide 142b, or in addition, the first light emitting layer 141 further includes a p-type semiconductor 141b, so that it may show improved light emitting characteristics and life-span characteristics.

In an embodiment, the light emitting layer 140 has a charge balance factor, which is a ratio (HT/ET) of a hole transport capability (HT) measured at a predetermined voltage (e.g., from about 1 volts to about 12 volts or at 3.5 volts) to an electron transport capability (ET) measured at a predetermined voltage (e.g., from about 1 volts to about 12 volts or at 3.5 volts), is greater than about 0.20 and less than about 0.56.

In order to obtain the charge balance factor of the light emitting layer 140 including the first light emitting layer 141 and the second light emitting layer 142, the more dominant carrier transport capability is measured in each of the first light emitting layer 141 and the second light emitting layer 142. That is, in the second light emitting layer 142 including the n-type metal oxide 142b, the electron transport capability (ET) is measured, and in the first light emitting layer 141 which may or may not further includes the p-type semiconductor 141b, the hole transport capability (HT) is measured.

The electron transport capability (ET) can be obtained from an electron-only device (EOD) in which the second light emitting layer 142 including the n-type metal oxide 142b is disposed as a single emitting layer, and the hole transport capability (HT) can be obtained from a hole-only-device (HOD) in which the first light emitting layer 141, which may or may not further includes the p-type semiconductor 141b, is disposed as a single emitting layer.

For example, a structure of the EOD may be an electrode/a lower electron auxiliary layer (e.g., electron injection layer, electron transport layer ("ETL"), or a combination thereof)/the second light emitting layer 142/an upper electron auxiliary layer (electron injection layer, electron transport layer, or a combination thereof)/an electrode (for a non-limiting example, ITO 200 nm/ZnMgO 30-50 nm/QD light emitting layer including the n-type metal oxide 20-30 nm/ZnMgO 30-50 nm/Al 100 nm). The materials of the upper electron auxiliary layer, the lower electron auxiliary layer, or a combination thereof may include the same materials as used materials in the electroluminescence device to be measured. The materials of the upper electron auxiliary layer, the lower electron auxiliary layer, or a combination thereof may include different materials as used materials in the electroluminescence device to be measured.

The electron transport capability (ET) may be obtained from a graph of the voltage-current density of the EOD. For example, the electron transport capability (ET) may increase in proportion to the content of the n-type metal oxide 142b included in the second light emitting layer 142. The electron transport capability may be measured at a voltage of greater than or equal to about 1 volts, greater than or equal to about 2 volts, or greater than or equal to about 3 volts, and less than or equal to about 12 volts, less than or equal to about 11 volts, less than or equal to about 10 volts, less than or equal to about 9 volts, less than or equal to about 8 volts, or less than or equal to about 7 volts. The electron transport capability may be measured at a voltage of about 3.5 volts.

For example, a structure of the HOD may be an electrode/a lower hole auxiliary layer (e.g., hole injection (delay) layer, hole transport layer ("HTL"), or a combination thereof)/the first light emitting layer 141/an upper hole auxiliary layer (e.g., hole injection layer, hole transport layer, or a combination thereof)/an electrode (for a non-limiting example, ITO 200 nm/poly(3,4-ethylenedioxythiophene)polystyrene sulfonate (PEDOT: PSS) 30 nm/poly(9,9-dioctyl-fluorene-co-N-(4-butylphenyl)-diphenylamine) (TFB) 25 nm/QD light emitting layer with or without the p-type semiconductor 20-30 nm/GSH0137 (a compound including a Bi-carbazole and a Bi-phenyl) 36 nm/dipyrazino[2,3-f:2',3'-h]quinoxaline-2,3,6,7,10,11-hexacarbonitrile (HAT-CN) 10 nm/Ag 100 nm). The materials of the upper hole auxiliary layer, the lower hole auxiliary layer, or a combination thereof may include the same materials as used materials in the electroluminescence device to be measured. The materials of the upper hole auxiliary layer, the lower hole auxiliary layer, or a combination thereof may include different materials as used materials in the electroluminescence device to be measured.

The hole transport capability (HT) may be obtained from a graph of the voltage-current density of the HOD. For example, the hole transport capability (HT) may increase in proportion to the content of the p-type semiconductor 141b included in the first light emitting layer 141. The hole transport capability may be measured at a voltage of greater than or equal to about 1 volts, greater than or equal to about 2 volts, or greater than or equal to about 3 volts, and less than or equal to about 12 volts, less than or equal to about 11 volts, less than or equal to about 10 volts, less than or equal to about 9 volts, less than or equal to about 8 volts, or less than or equal to about 7 volts. The hole transport capability may be measured at a voltage of about 3.5 volts.

For example, the HT and ET values are measured by a predetermined number of times (e.g., three times) at a predetermined voltage interval (e.g., from −2 volts to 8 volts intervals) at a predetermined rate (e.g., 0.2 volts unit). The HT and ET values may be selected from the values of three times at a predetermined voltage (e.g., 3.5 volts).

When the electroluminescent device 10, 10' includes the n-type metal oxide 142b in the second light emitting layer 142, and may further include the p-type semiconductor 141b in the first light emitting layer 141, the light emitting layer 140 has the charge balance factor of greater than about 0.20, greater than or equal to about 0.21, greater than or equal to about 0.22, greater than or equal to about 0.23, greater than or equal to about 0.24, or greater than or equal to about 0.25, less than about 0.56, less than or equal to about 0.55, less than or equal to about 0.54, less than or equal to about 0.53, less than or equal to about 0.52, less than or equal to about 0.51, less than or equal to about 0.50, less than or equal to about 0.49, less than or equal to about 0.48, less than or equal to about 0.47, less than or equal to about 0.46, or less than or equal to about 0.45, and greater than about 0.20 and less than about 0.56, about 0.21 to about 0.55, about 0.25 to about 0.45, about 0.25 to about 0.40, or about 0.25 to about 0.38. When the charge balance factor is within the above range, the electroluminescent device 10 may exhibit improved light emitting and life-span characteristics (e.g., T50).

In this case, the HT may be less than about 3.0 milliamperes per square centimeter (mA/cm$^2$), less than or equal to about 2.5 mA/cm$^2$, less than or equal to about 2.0 mA/cm$^2$, or less than or equal to about 1.5 mA/cm$^2$, and greater than about 0.5 mA/cm$^2$, greater than or equal to about 1.0 mA/cm$^2$, or greater than or equal to about 1.5 mA/cm$^2$. The ET may be less than or equal to about 5.4 mA/cm$^2$, or less than or equal to about 5.0 mA/cm$^2$, and greater than or equal to about 1 mA/cm$^2$ or greater than or equal to about 4.0 mA/cm$^2$. In an embodiment, the hole transport layer 130 may include an organic material such as the p-type semiconductor, the first light emitting layer 141 may include an organic material such as the p-type monomolecular organic semiconductor (hereinafter referred to as p-type organic material), the second light emitting layer 142 may include an inorganic material such as the n-type metal oxide 142b (hereinafter referred to as n-type inorganic material), and the electron transport layer 150 may include an inorganic material such the inorganic material nanoparticles.

In this case, the holes are injected from the hole transport layer 130 including the organic material into the first light emitting layer 141 including the p-type organic material, and electrons are injected from the electron transport layer 150 including the inorganic material to the second light emitting layer 142 including the n-type inorganic material. Since, holes are efficiently injected from organic materials to organic materials and electrons are efficiently injected from inorganic materials to inorganic materials, a turn-on voltage may be remarkably reduced, an external quantum efficiency ("EQE") and a luminance may be remarkably improved, and life-span characteristics (e.g., T50) may be improved.

Hereinafter, a display device including the aforementioned electroluminescent devices 10 and 10' is described.

A display device according to an embodiment includes a substrate, a driving circuit disposed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

Only one of the first to third electroluminescent devices may be the aforementioned electroluminescent device 10. In this case, the third electroluminescent device displaying at least blue may be desirably the aforementioned electroluminescent device 10.

In the display device according to an embodiment, a hole injection layer, a hole transport layer, an electron transport layer, an electron injection layer, and a hole blocking layer except a light emitting layer of each pixel may be integrated to form a common layer. However, an embodiment is not limited thereto. A hole injection layer, a hole transport layer, an electron transport layer, an electron injection layer, and a hole blocking layer may be independently disposed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may include or be made of a ductile material. The substrate may include glass or a polymer material in a film having a glass transition temperature (Tg) of greater than about 150° C. For example, it includes a COC (cycloolefin copolymer) or COP (cycloolefin polymer) based material. All the first to third electroluminescent devices are disposed on the substrate. That is, a substrate of the display device according to an embodiment provides a common layer. The driving circuit is disposed on the substrate and is independently connected to each of the first to third electroluminescent devices. The driving circuit may include at least one line including a scan line, a data line, a driving power source line, a common power source line, and the like, at least two of thin film transistors ("TFT") connected to the wire and corresponding to one organic light emitting diode, and at least one capacitor, or the like. The driving circuit may have a variety of the known structures.

As described above, a display device according to an embodiment may exhibit improved device efficiency and thus improved life-span and luminous efficiency.

Hereinafter, the embodiments are illustrated in more detail with reference to examples. These examples, however, are not in any sense to be interpreted as limiting the scope of the invention.

Synthesis of Metal Oxide

Zinc acetate dihydrate and magnesium acetate tetrahydrate are added to dimethyl sulfoxide in a reactor so that a mole ratio of the following chemical formula is provided, and the reactor is heated at 60° C. in the air. Subsequently, an ethanol solution of tetramethyl ammonium hydroxide pentahydrate is added in a dropwise fashion thereto at a rate of 3 milliliters per minute (mL/min). The obtained mixture is stirred for one hour, and $Zn_{1-x}Mg_xO$ nanoparticles produced therein are centrifuged and dispersed in ethanol to obtain $Zn_{1-x}Mg_xO$ nanoparticles ($0 \leq x \leq 0.5$).

The obtained nanoparticles are performed with an X-ray diffraction analysis to confirm that ZnO crystals are formed. A transmission electron microscopic analysis is performed for the obtained nanoparticles, and the results show that the particles have an average size of about 3 nm.

Verification Example 1

After a first electrode (anode), ITO-deposited glass substrate is surface-treated with UV-ozone for 15 minutes, a PEDOT: PSS solution (HOMO energy level: −5.35 electronvolts (eV), HC Starks) is spin-coated thereon and is heat-treated 150° C. for 30 minutes in a nitrogen atmosphere to form a 30 nm-thick hole injection layer.

Then, a solution in which poly[(9,9-dioctylfluorenyl-2,7-diyl-co(4,4'-(N-4-butylphenyl) diphenylamine] (TFB, HOMO energy level: −5.56 eV, LUMO energy level: −2.69 eV, Sumitomo Co., Ltd.) is dissolved in o-xylene is spin-coated on the hole injection layer and heat-treated at 150° C. for 30 minutes to form a 25 nm-thick first hole transport layer.

Subsequently, a composition for forming a blue light emitting layer that 4,4'-bis(N-carbazolyl)-1,1'-biphenyl (CBP, HOMO energy level: −5.7 eV, LUMO energy level: −2.6 eV) and ZnTeSe/ZnSeS core-shell blue quantum dots (average particle diameter: 10 nm, peak wavelength: about 451 nm, HOMO energy level: −5.7 eV, LUMO energy level: −3.0 eV) having attached oleate as a hydrophobic ligand are dispersed in octane is coated thereon and then heated at 80° C. to provide a blue light emitting layer having a thickness of 20 nm (CBP content in a blue light emitting layer: 8 wt %).

Then, a bicarbazole-based compound (GSH0137, manufacturer: Samsung SDI) is deposited on the blue light emitting layer to provide a second hole transport layer having a thickness of 36 nm.

Then, 1,4,5,8,9,11-Hexaazatriphenylenehexacarbonitrile (HAT-CN) is deposited on the second hole transport layer to form a 10 nm-thick hole injection layer.

Then, 100 nm of aluminum is vacuum-deposited on the hole injection layer to provide a second electrode, so that HOD (Hole Only Device) according to Verification Example 1 is obtained (ITO/PEDOT:PSS/TFB/Blue QD:CBP (8 wt %)/GSH0137/HAT-CN/Ag).

Comparative Verification Example 1

HOD (ITO/PEDOT:PSS/TFB/Blue QD/GSH0137/HAT-CN/Ag) according to Comparative Verification Example 1 is obtained in accordance with the same procedure as in Verification Example 1, except that the blue light emitting layer is formed using a composition for forming a blue light emitting layer including no CBP.

Figure 5:
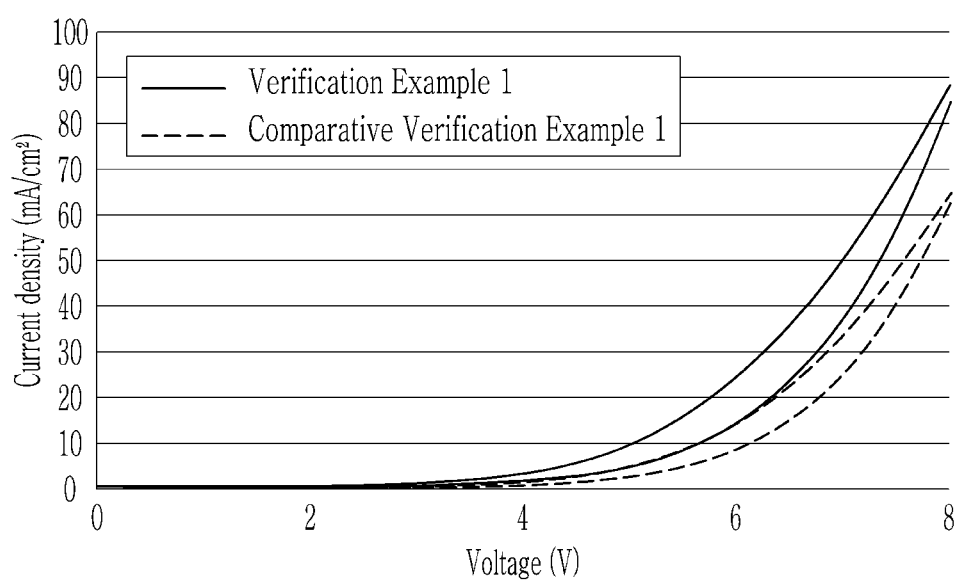
FIG. 5 is a current density versus voltage graph of the hole only devices (hereinafter referred to as "HOD") according to Verification Example 1 and Comparative Verification Example 1.

HODs according to Verification Example 1 and Comparative Verification Example 1 are each measured for a voltage-current density, and the results are shown in FIG. 5.

FIG. 5 is a current density (mA/cm$^2$) versus voltage (voltages (V)) graph of the hole only devices (HOD) according to Verification Example 1 and Comparative Verification Example 1.

Referring to FIG. 5, it is confirmed that Verification Example 1 including CBP in the blue light emitting layer shows more excellent current density to voltage than Comparative Verification Example 1 including no CBP.

Thus, from the results of FIG. 5, it is understood that the charge transport capability (specifically, hole transport capability) of the device is improved when including a predetermined amount of CBP on forming the blue light emitting layer.

Verification Example 2

After performing a surface treatment with UV-ozone on a first electrode (anode) of a ITO-deposited glass substrate for 15 minutes, a solution for forming an electron transport layer that ZnMgO (average particle diameter: 3 nm) is dispersed in ethanol is spin-coated thereon and heated at 80° C. for 30 minutes to provide a first electron transport layer having a thickness of 20 nm.

Subsequently, a composition for forming a blue light emitting layer that ZnTeSe/ZnSeS core-shell blue quantum dots (average particle diameter: 10 nm, peak wavelength: about 451 nm, HOMO energy level: −5.7 eV, LUMO energy level: −3.0 eV) having attached oleate as a hydrophobic ligand and ZnMgO (average particle diameter: 3 nm, HOMO energy level: −7.7 eV, LUMO energy level: −4.3 eV) having attached oleate on a surface are dispersed in hexane is coated thereon and then heated at 80° C. to provide a blue light emitting layer having a thickness of 20 nm.

Subsequently, a solution for forming an electron transport layer that ZnMgO (average particle diameter: 3 nm) is dispersed in ethanol is spin-coated on the light emitting layer and heated at 80° C. for 30 minutes to provide a second electron transport layer having a thickness of 20 nm.

Subsequently, 100 nm aluminum is vacuum-deposited on the second electron transport layer to provide a second electrode, so that EOD (Electron Only Device) according to Verification Example 2 is obtained (ITO/ZnMgO/Blue QD:ZnMgO (3 wt %)/ZnMgO/Al).

Verification Example 3

EOD according to Verification Example 3 (ITO/ZnMgO/Blue QD:ZnMgO (5 wt %)/ZnMgO/Al) is obtained in accordance with the same procedure as in Verification Example 2, except that the adding amount of ZnMgO is adjusted so that the ZnMgO content in the blue light emitting layer is 5 wt %.

Verification Example 4

EOD according to Verification Example 4 (ITO/ZnMgO/Blue QD:ZnMgO (10 wt %)/ZnMgO/Al) is obtained in accordance with the same procedure as in Verification Example 2, except that the adding amount of ZnMgO is adjusted so that the ZnMgO content in the blue light emitting layer is 10 wt %.

Comparative Verification Example 2

EOD according to Comparative Verification Example 2 (ITO/ZnMgO/Blue QD/ZnMgO/Al) is obtained in accordance with the same procedure as in Verification Example 2, except that the blue light emitting layer is formed using a composition for forming a blue light emitting layer including no ZnMgO. The EODs according to Verification Examples 2 to 4 and Comparative Verification Example 2 are each measured for a voltage-current density, and the results are shown in FIG. 6.

Figure 6:
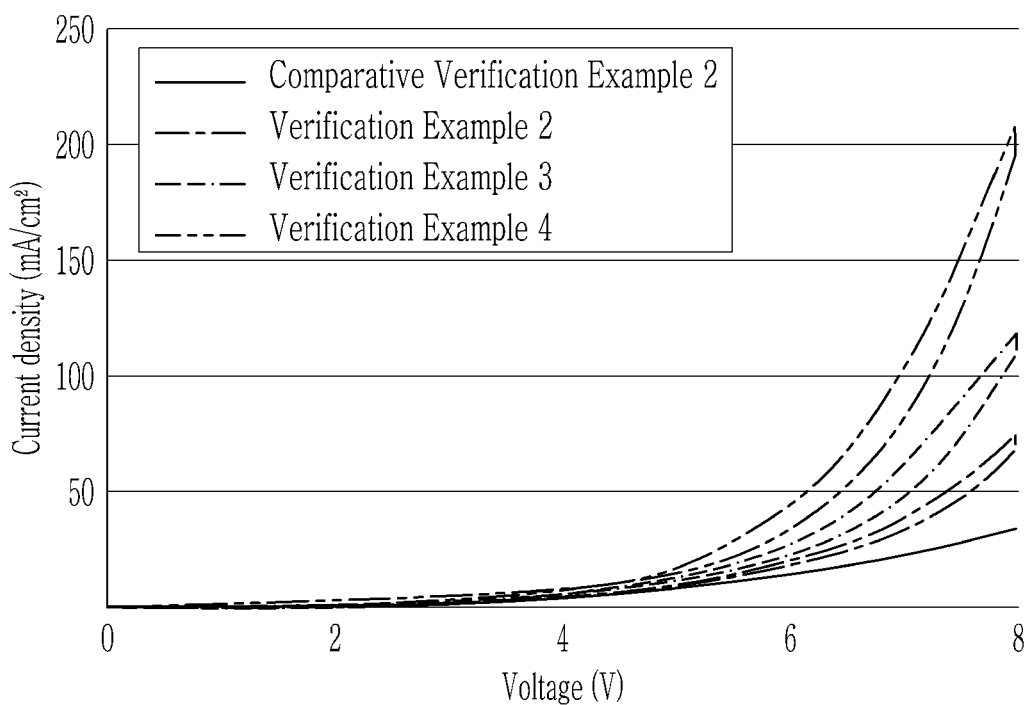
FIG. 6 is a current density versus voltage graph of the electron only devices (hereinafter referred to as "EOD") according to Verification Examples 2 to 4 and Comparative Verification Example 2.

FIG. 6 is a current density (mA/cm$^2$) versus voltage (voltages (V)) graph of the electron only devices (EOD) according to Verification Examples 2 to 4 and Comparative Verification Example 2.

Referring to FIG. 6, it is confirmed that Verification Examples 2 to 4 in which ZnMgO is included in the blue light emitting layer shows more excellent current density to voltage than Comparative Verification Example 2. It is confirmed that the current density to voltage is also gradually increased as ZnMgO in the blue light emitting layer is gradually increasing from 3 wt % to 5 wt %, and 10 wt %.

Accordingly, from the results of FIG. 6, it is understood that the charge transport capability (specifically, electron transport capability) of the device is improved when including a predetermined amount of ZnMgO on forming the blue light emitting layer.

Example 1

After a first electrode (anode), ITO (work function: −4.850 eV)-deposited glass substrate is surface-treated with UV-ozone for 15 minutes, a PEDOT solution (HOMO energy level: −5.3 eV, H.C. Starks) is spin-coated thereon and is heat-treated 150° C. for 30 minutes in a nitrogen atmosphere to form a 30 nm-thick hole injection layer.

Then, a solution in which poly[(9,9-dioctylfluorenyl-2,7-diyl-co(4,4'-(N-4-butylphenyl) diphenylamine] (TFB, HOMO energy level: −5.56 eV, LUMO energy level: −2.69 eV, Sumitomo Co., Ltd.) is dissolved in toluene is spin-coated on the hole injection layer and heat-treated at 150° C. for 30 minutes to form a 25 nm-thick hole transport layer.

Subsequently, ZnTeSe/ZnSeS core-shell blue quantum dots (average particle diameter: 10 nm, peak wavelength: about 451 nm, HOMO energy level: −5.7 eV, LUMO energy level: −3.0 eV) having attached oleate as a hydrophobic ligand on the surface is added into octane and stirred for 5 minutes to provide a composition for a first blue light emitting layer. Then, the composition for a first blue light emitting layer is spin-coated on a hole transport layer and heated at 120° C. under a nitrogen atmosphere for 30 minutes to provide a 28 nm-thick first blue light emitting layer.

ZnTeSe/ZnSeS core-shell quantum dots (average particle diameter: 10 nm, peak wavelength: about 451 nm, HOMO energy level: −5.9 eV, LUMO energy level: −3.2 eV) having attached chloride (Cl) on the surface and ZnMgO (average particle diameter: 3 nm, HOMO energy level: −7.7 eV, LUMO energy level: −4.3 eV) having attached oleate on the surface are added into hexane and stirred for 5 minutes to provide a composition for a second blue light emitting layer.

Subsequently, the composition for a second blue light emitting layer is spin-coated on the first blue light emitting layer and heated at 120° C. under a nitrogen atmosphere for 30 minutes to provide a 13 nm-thick second blue light emitting layer (ZnMgO content in second blue light emitting layer: 3 wt %)

Then, a solution for forming an electron transport layer that ZnMgO (average particle diameter: 3 nm) is dispersed in ethanol is spin-coated on the second blue light emitting layer and heated at 80° C. for 30 minutes to provide a 20 nm-thick electron transport layer.

Then, 100 nm of aluminum (work function: −4.3 eV) is vacuum-deposited on the electron transport layer to provide a second electrode, so that an electroluminescent device according to Example 1 [ITO/PEDOT/TFB/Blue QD/Blue QD:ZnMgO (3 wt %)/ZnMgO/Al] is obtained.

Example 2

An electroluminescent device according to Example 2 [ITO/PEDOT/TFB/Blue QD/Blue QD:ZnMgO (5 wt %)/ZnMgO/Al] is obtained in accordance with the same procedure as in Example 1, except that the adding amount of ZnMgO in the composition for forming a second blue light emitting layer is adjusted so that the ZnMgO content in the second blue light emitting layer is 5 wt %.

Example 3

An electroluminescent device according to Example 3 [ITO/PEDOT/TFB/Blue QD/Blue QD:ZnMgO (10 wt %)/ZnMgO/Al] is obtained in accordance with the same procedure as in Example 1, except that the adding amount of ZnMgO in the composition for forming a second blue light emitting layer is adjusted so that the ZnMgO content in the second blue light emitting layer is 10 wt %.

Comparative Example 1

An electroluminescent device according to Comparative Example 1 (ITO/PEDOT/TFB/Blue QD/ZnMgO/Al) is obtained in accordance with the same procedure as in Example 1, except that the blue single light emitting layer is formed in a thickness of 28 nm using a composition for a first blue light emitting layer including no ZnMgO instead of forming the first and second blue light emitting layers.

Comparative Example 2

An electroluminescent device according to Comparative Example 2 [ITO/PEDOT/TFB/Blue QD/Blue QD:ZnMgO (15 wt %)/ZnMgO/Al] is obtained in accordance with the same procedure as in Example 1, except that the adding amount of ZnMgO in the composition for forming a second blue light emitting layer is adjusted so that a ZnMgO content in the second blue light emitting layer is 15 wt %.

Evaluation 1: Light Emitting and Life-Span Characteristics of Blue Dual Light Emitting Layer Including ZnMgO Light emitting characteristics of the electroluminescent devices according to Examples 1 and 2 and Comparative Examples 1 to 2 and life-span characteristics of the electroluminescent devices according to Examples 1 and 2 and Comparative Examples 1 to 2 are each measured, and the results are shown in Tables 1 to 2.

TABLE 1

|  | Maximum EQE (%) | Maximum luminance [cd/m$^2$] | EQE@1000 nt [cd/m$^2$] | EQE@2000 nt [cd/m$^2$] | EQE@10000 nt [cd/m$^2$] | Maximum luminous efficiency [cd/A] | Driving voltage@5 mA [V] |
|---|---|---|---|---|---|---|---|
| Ex. 1 | 8.7 | 27540 | 8.6 | 7.7 | 5.6 | 6.1 | 3.2 |
| Ex. 2 | 8.8 | 27970 | 8.4 | 8 | 6.1 | 6.1 | 3.1 |
| Ex. 3 | 8.9 | 25467 | 8.7 | 8.1 | 6.0 | 5.8 | 3.0 |
| Comp. Ex. 1 | 8 | 23340 | 7.8 | 7.1 | 5.1 | 5.5 | 3.2 |
| Comp. Ex. 2 | 8.4 | 24181 | 8.2 | 7.7 | 5.4 | 5.5 | 3.0 |

|  | Luminance@5 mA [cd/m$^2$] | Driving voltage@1000 nt [V] | Peak emission wavelength [nm] | Full width at half maximum (FWHM) [nm] | CIE x | CIE y |
|---|---|---|---|---|---|---|
| Ex. 1 | 283 | 3.4 | 454 | 21 | 0.146 | 0.0695 |
| Ex. 2 | 296 | 3.3 | 454 | 21 | 0.146 | 0.067 |
| Ex. 3 | 267 | 3.3 | 454 | 21 | 0.146 | 0.061 |
| Comp. Ex. 1 | 265 | 3.5 | 454 | 21 | 0.147 | 0.0672 |
| Comp. Ex. 2 | 263 | 3.4 | 454 | 21 | 0.147 | 0.063 |

Here, cd/A is Candela per ampere.

TABLE 2

|  | T95 (h) | T50 (h) | Injection current (mA) | Initial P. current (μA) | Initial driving voltage (V) | Driving voltage@T50 (V) |
|---|---|---|---|---|---|---|
| Ex. 1 | 1.56 | 13.5 | 0.460 | 3.018 | 3.5 | 4.3 |
| Ex. 2 | 1.38 | 14.0 | 0.361 | 2.923 | 3.3 | 3.9 |

TABLE 2-continued

|  | T95 (h) | T50 (h) | Injection current (mA) | Initial P. current (µA) | Initial driving voltage (V) | Driving voltage@T50 (V) |
|---|---|---|---|---|---|---|
| Ex. 3 | 1.71 | 16.4 | 0.350 | 2.984 | 3.1 | 3.7 |
| Comp. Ex 1 | 0.34 | 6.4 | 0.699 | 2.972 | 3.1 | 3.4 |

T95 and T80 in Table 2 mean a time of showing a luminance at 95% (in case of T95) and 50% (in case of T50) relative to the initial luminance (for example, 4500 nit), respectively. The terms of Initial P. current indicate to a numeric value that light emitted by driving the device is converted to a current (measured by micrometers (µA)) through a light-receiving sensor (photodiode), which means a light intensity emitted from the device. In other words, Initial P. current means that the measurement is begun for the electroluminescent devices according to Examples and Comparative Examples in a substantially equivalent light intensity.

First, referring to Table 1, it is confirmed that the electroluminescent devices according to Examples 1 and 2 show more excellent driving efficiency and luminous efficiency than the electroluminescent devices according to Comparative Examples 1 to 2.

In addition, referring to Table 2, it is confirmed that the electroluminescent devices according to Examples 1 and 2 have excellent life-span characteristics.

Thus, from the results of Tables 1 to 2, it is understood that the electroluminescent device according to Example shows more excellent light emitting characteristics and/or life-span characteristics than the electroluminescent devices having a blue single light emitting layer or including excessive amount of ZnMgO in the second blue light emitting layer.

Example 4

After a first electrode (anode), ITO (work function: −4.850 eV)-deposited glass substrate is surface-treated with UV-ozone for 15 minutes, a PEDOT solution (HOMO energy level: −5.35 eV, H.C. Starks) is spin-coated thereon and is heat-treated 150° C. for 30 minutes in a nitrogen atmosphere to form a 30 nm-thick hole injection layer.

Then, a solution in which poly[(9,9-dioctylfluorenyl-2,7-diyl-co(4,4'-(N-4-butylphenyl) diphenylamine] (TFB, HOMO energy level: −5.56 eV, LUMO energy level: −2.69 eV, Sumitomo Co., Ltd.) is dissolved in toluene is spin-coated on the hole injection layer and heat-treated at 150° C. for 30 minutes to form a 25 nm-thick first hole transport layer.

Subsequently, ZnTeSe/ZnSeS core-shell blue quantum dots (average particle diameter: 10 nm, peak wavelength: about 451 nm, HOMO energy level: −5.7 eV, LUMO energy level: −3.0 eV) having attached oleate as a hydrophobic ligand on the surface and 4,4'-bis(N-carbazolyl)-1,1'-biphenyl (CBP, HOMO energy level: −5.7 eV, LUMO energy level: −2.6 eV) are added into octane and stirred for 5 minutes to provide a composition for forming a first blue light emitting layer. Then the composition for forming a first blue light emitting layer is spin-coated on a hole transport layer and heated at 120° C. for 30 minutes under a nitrogen atmosphere to provide a 28 nm-thick first blue light emitting layer. Then zinc chloride ethanol solution (concentration: 10 milligrams per milliliter (mg/mL)) is added in a dropwise fashion onto the first blue light emitting layer and reacted for 1 minute to substitute a portion of oleate attached to quantum dots of the first blue light emitting layer with chloride (CBP content in first blue light emitting layer: 8 wt %).

ZnTeSe/ZnSeS core-shell blue quantum dots (average particle diameter: 10 nm, peak wavelength: about 451 nm, HOMO energy level: −5.7 eV, LUMO energy level: −3.0 eV) having attached oleate as a hydrophobic ligand on the surface and ZnMgO (average particle diameter: 3 nm, HOMO energy level:−7.7 eV, LUMO energy level: −4.3 eV) having attached oleate on the surface are added into hexane and stirred for 5 minutes to provide a composition for forming a second blue light emitting layer.

Then a composition for forming a second blue light emitting layer is spin-coated on the chloride-substituted first blue light emitting layer and then heated at 120° C. under a nitrogen atmosphere for 30 minutes to provide a 13 nm-thick second blue light emitting layer (ZnMgO content in second blue light emitting layer: 5 wt %)

Subsequently, a solution for forming an electron transport layer that ZnMgO (average particle diameter: 3 nm) is dispersed in ethanol is spin-coated on the second blue light emitting layer and heated at 80° C. for 30 minutes to provide a 20 nm-thick electron transport layer.

Subsequently, 100 nm aluminum (work function: −4.3 eV) is vacuum-deposited on the electron transport layer to provide a second electrode, so that an electroluminescent device according to Example 4 [ITO/PEDOT/TFB/Blue QD:CBP (8 wt %)/Blue QD:ZnMgO (5 wt %)/ZnMgO/Al] is obtained.

Example 5

An electroluminescent device according to Example 5 [ITO/PEDOT/TFB/Blue QD:CBP (10 wt %)/Blue QD:ZnMgO (3 wt %)/ZnMgO/Al] is obtained in accordance with the same procedure as in Example 4, except that the adding amounts of CBP and ZnMgO in the compositions for forming the first, second blue light emitting layers are each adjusted so that the CBP content in the first blue light emitting layer is 10 wt % and the ZnMgO content in the second blue light emitting layer is 3 wt %.

Example 6

An electroluminescent device according to Example 6 [ITO/PEDOT/TFB/Blue QD:CBP (8 wt %)/Blue QD:ZnMgO (3 wt %)/ZnMgO/Al] is obtained in accordance with the same procedure as in Example 4, except that the adding amount of ZnMgO in the composition for forming a second blue light emitting layer is adjusted so that the ZnMgO content in the second blue light emitting layer is 3 wt %.

Comparative Example 3

An electroluminescent device according to Comparative Example 3 (ITO/PEDOT/TFB/Blue QD (thickness: 41 nm)/ZnMgO/Al) is obtained in accordance with the same procedure as in Example 4, except that the blue single light emitting layer is formed in a thickness of 41 nm using the composition for forming the first blue light emitting layer including no ZnMgO instead of forming the first, second blue light emitting layers.

Evaluation 2: Light Emitting and Life-Span Characteristics of p-n Junction Blue Dual Light Emitting Layer Including ZnMgO and CBP Light emitting characteristics and life-span characteristics are measured for the electroluminescent devices according to Examples 4 to 6 and Comparative Example 3, and the results are shown in Tables 3 to 4, respectively.

TABLE 3

|  | Maximum EQE (%) | Maximum luminance [cd/m²] | EQE@ 1000 nt [cd/m²] | EQE@2000 nt [cd/m²] | EQE@10000 nt [cd/m²] | Maximum luminous efficiency [cd/A] | Driving voltage@ 5 mA [V] |
|---|---|---|---|---|---|---|---|
| Ex. 4 | 8.0 | 17760 | 6.4 | 5.8 | 4.5 | 4.8 | 3.8 |
| Ex. 5 | 7.4 | 17310 | 5.3 | 4.7 | 4.3 | 4.3 | 4.0 |
| Ex. 6 | 9.6 | 19460 | 7.9 | 6.8 | 5.1 | 5.8 | 3.9 |
| Comp. Ex. 3 | 3.4 | 14960 | 2.4 | 2.6 | 3.3 | 1.9 | 4.3 |

|  | Luminance@ 5 mA [cd/m²] | Driving voltage@1000 nt [V] | Peak emission wavelength [nm] | Full width at half maximum (FW HM) [nm] | CIE x | CIE y |
|---|---|---|---|---|---|---|
| Ex. 4 | 217 | 4.2 | 451 | 20 | 0.1501 | 0.0552 |
| Ex. 5 | 184 | 4.4 | 451 | 20 | 0.1500 | 0.0531 |
| Ex. 6 | 267 | 4.1 | 451 | 19 | 0.1510 | 0.0549 |
| Comp. Ex. 3 | 52 | 49 | 452 | 19 | 0.1500 | 0.0556 |

TABLE 4

|  | T95 (h) | T50 (h) | Injection current (mA) | Initial P. current (µA) | Initial driving voltage (V) | Driving voltage @T50 (V) |
|---|---|---|---|---|---|---|
| Ex. 4 | 3.12 | 22.3 | 0.280 | 2.955 | 3.5 | 4.8 |
| Ex. 5 | 4.21 | 23.4 | 0.291 | 2.975 | 3.6 | 5.0 |
| Ex. 6 | 3.70 | 20.5 | 0.281 | 2.907 | 3.6 | 5.0 |
| Comp. Ex. 3 | 1.03 | 15.2 | 0.283 | 2.935 | 3.8 | 5.4 |

Referring to Table 3, it is confirmed that the electroluminescent devices having a blue dual light emitting layer according to Examples 4 to 6 show more excellent driving efficiency and luminous efficiency than the electroluminescent device having a blue single light emitting layer according to Comparative Example 3. In addition, referring to Table 4, it is confirmed that the electroluminescent device having a blue dual light emitting layer according to Example 6 shows more excellent life-span characteristics than the electroluminescent device having a blue single light emitting layer according to Comparative Example 3.

Accordingly, from the results of Tables 3 to 4, it is understood that the electroluminescent device having a blue dual light emitting layer according to Example shows more excellent light emitting and life-span characteristics than the electroluminescent device having a blue single light emitting layer.

Comparative Example 4

After a first electrode (anode), ITO (work function: −4.850 eV)-deposited glass substrate is surface-treated with UV-ozone for 15 minutes, a PEDOT solution (HOMO energy level: −5.3 eV, H.C. Starks) is spin-coated thereon and is heat-treated 150° C. for 30 minutes in a nitrogen atmosphere to form a 30 nm-thick hole injection layer.

Then, a solution in which poly[(9,9-dioctylfluorenyl-2,7-diyl-co(4,4'-(N-4-butylphenyl) diphenylamine] (TFB, HOMO energy level: −5.56 eV, LUMO energy level: −2.69 eV, Sumitomo Co., Ltd.) is dissolved in toluene is spin-coated on the hole injection layer and heat-treated at 150° C. for 30 minutes to form a 25 nm-thick first hole transport layer.

Subsequently, ZnTeSe/ZnSeS core-shell blue quantum dots having attached oleate as a hydrophobic ligand on the surface (average particle diameter: 10 nm, peak wavelength: about 451 nm, HOMO energy level: −5.7 eV, LUMO energy level: −3 eV) and ZnMgO having attached oleate on the surface (average particle diameter: 3 nm, HOMO energy level: −7.7 eV, LUMO energy level: −4.3 eV) are added into hexane and stirred for 5 minutes to provide a composition for forming a blue light emitting layer. Then the composition for forming a blue light emitting layer is spin-coated on a hole transport layer and heat-treated at 120° C. under a nitrogen atmosphere for 30 minutes to provide a blue single light emitting layer having a thickness of 28 nm. Then zinc chloride ethanol solution (concentration: 10 mg/mL) is added in a dropwise fashion onto the blue single light emitting layer and reacted for 1 minute to substitute oleate attached to quantum dots of the blue single light emitting layer with chloride (ZnMgO content in blue single light emitting layer: 3 wt %).

Subsequently, a solution for forming an electron transport layer that ZnMgO (average particle diameter: 3 nm) is dispersed in ethanol is spin-coated on the blue single light emitting layer and heat-treated at 80° C. for 30 minutes to provide a 20 nm-thick electron transport layer.

Subsequently, 100 nm aluminum (work function: −4.3 eV) is vacuum-deposited on the electron transport layer to provide a second electrode, so that an electroluminescent device according to Comparative Example 4 is obtained [ITO/PEDOT/TFB/Blue QD:ZnMgO (3 wt %)/ZnMgO/Al].

Comparative Example 5

An electroluminescent device according to Comparative Example 5 [ITO/PEDOT/TFB/Blue QD:ZnMgO (5 wt %)/ZnMgO/Al] is obtained in accordance with the same procedure as in Comparative Example 4, except that the adding amount of ZnMgO in the composition for forming a blue light emitting layer is adjusted so that the ZnMgO content in the blue single light emitting layer is 5 wt %.

Evaluation 3: Light Emitting and Life-Span Characteristic Comparison of Blue Single Light Emitting Layer Depending Upon ZnMgO Content Light emitting characteristics and life-span characteristics of the electroluminescent devices according to Comparative Examples 1, 4, and 5 are measured, and the results are each shown in FIGS. 7 to 8.

Figure 7:
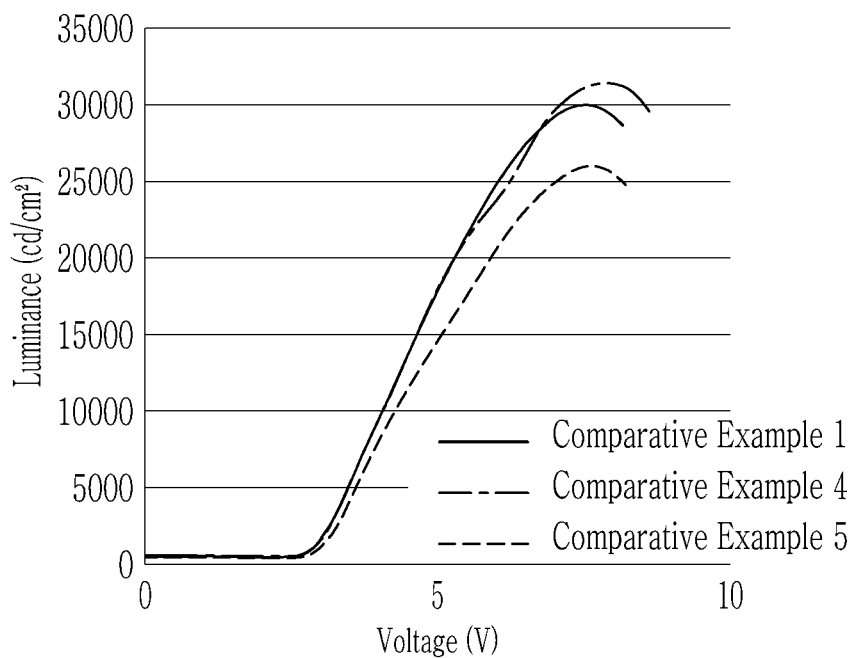
FIG. 7 is a luminance (unit: Candela per square meter ($cd/m^2$)) versus voltage graph of the electroluminescent devices according to Comparative Examples 1, 4, and 5.
Figure 8:
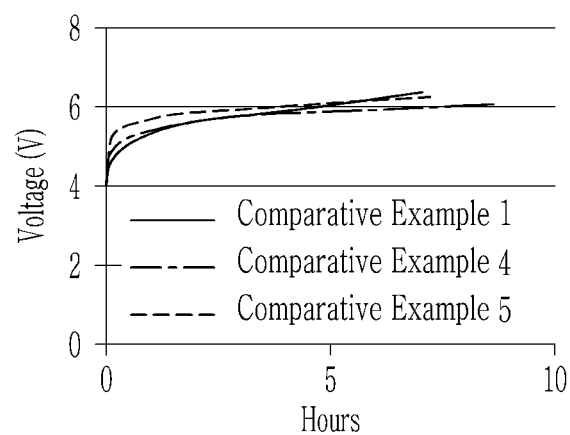
FIG. 8 is a voltage (unit: voltages) versus time (unit: %) graph of the electroluminescent devices according to Comparative Examples 1, 4, and 5.

FIG. 7 is a luminance (unit: cd/m$^2$) versus voltage (V) graph of the electroluminescent devices according to Comparative Example 1, Comparative Example 4 and Comparative Example 5, and FIG. 8 is a voltage (unit: %) versus time graph of the electroluminescent devices according to Comparative Examples 1, 4, and 5.

Referring to FIGS. 7 to 8, it is confirmed that in the electroluminescent device having the blue single light emitting layer, the driving voltage is even increased by adding ZnMgO into the light emitting layer, and the life-span characteristics are deteriorated.

In addition, referring together with the results of Evaluation 1 based on Comparative Example 1, it is confirmed that the case of the electroluminescent device having the blue single light emitting layer does not show the effects on improving the electron-hole balance in whole the device having the blue single light emitting layer, although the electron transfer characteristics and/or hole blocking characteristics are improved by including ZnMgO.

Evaluation 4: Life-Span Characteristic Comparison Between Blue Dual Light Emitting Layer and Blue Single Light Emitting Layer Depending Upon Changing ZnMgO Content For the electroluminescent device including a blue dual light emitting layer and the electroluminescent device including a blue single light emitting layer, each T50-initial voltage relationship depending upon changing the ZnMgO content in the light emitting layer is summarized and shown in FIG. 9.

The electroluminescent device including the blue dual light emitting layer is obtained by adjusting the ZnMgO content in the second blue light emitting layer to each 0 wt %, 3 wt %, 5 wt %, and 7 wt % from the manufacturing method according to Example 4; and the electroluminescent device including the blue single light emitting layer is obtained by adjusting the ZnMgO content to each 0 wt %, 3 wt %, and 5 wt % from the manufacturing method according to Comparative Example 3.

Figure 9:
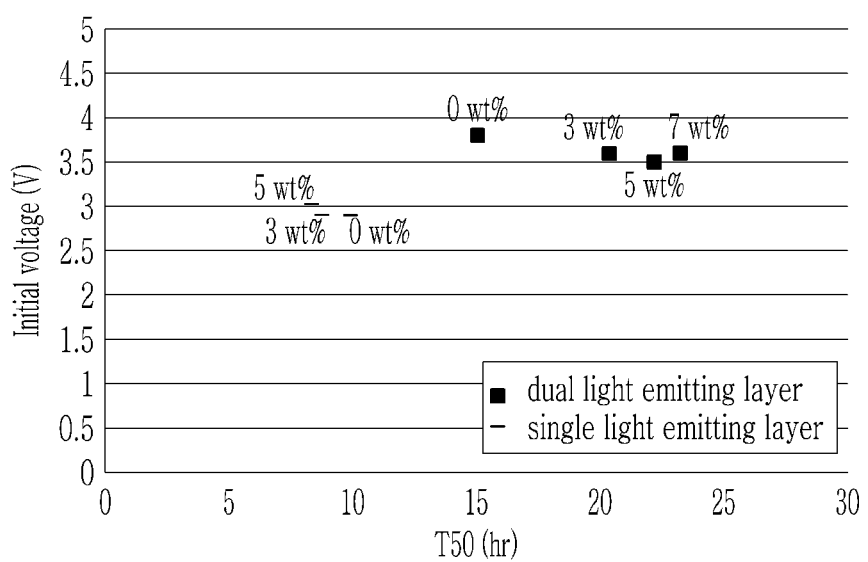
FIG. 9 is a T50-initial voltage versus time graph for the electroluminescent device including a blue dual light emitting layer and the electroluminescent device including a blue single light emitting layer.

FIG. 9 is a T50-initial voltage (unit: voltage) versus time (unit: hours) graph for the electroluminescent device including a blue dual light emitting layer and the electroluminescent device including a blue single light emitting layer. In FIG. 9, T50 means a time when the electroluminescent device shows a luminance of 50% relative to the initial luminance.

Referring to FIG. 9, it is confirmed that the case of the electroluminescent device having the blue dual light emitting layer basically shows more excellent T50-initial voltage than the electroluminescent device having the blue single light emitting layer. It is confirmed that the case of the electroluminescent device that the first and second blue light emitting layers form a p-n junction even if having the blue dual light emitting layer (i.e., a case of having the blue dual light emitting layer and having a ZnMgO content in the second blue light emitting layer of 3 wt %, 5 wt %, or 7 wt %) shows more improved T50 value than the case of including no ZnMgO.

Accordingly, from the results of FIG. 9, it is confirmed that the electroluminescent device having the blue dual light emitting layer (doped with n-type semiconductor such as ZnMgO, etc. or not doped) shows more excellent life-span characteristics than the electroluminescent devices having the blue single light emitting layer, and the electroluminescent device having the blue dual light emitting layer in which the second light emitting layer is doped with n-type semiconductor such as ZnMgO shows more excellent life-span characteristics than the electroluminescent devices having the blue single light emitting layer in which the second light emitting layer is not doped.

Evaluation 5: Light Emitting Characteristic Comparison Between Blue Dual Light Emitting Layer and Blue Single Emitting Layer Depending Upon Changing ZnMgO Content For the electroluminescent device including the blue dual light emitting layer and the electroluminescent device including the blue single light emitting layer, a relationship of ZnMgO content in the light emitting layer-external quantum efficiency and a relationship of ZnMgO content-maximum luminance are summarized, and the results are shown in FIGS. 10 to 13, respectively. The electroluminescent device including the blue dual light emitting layer and the electroluminescent device including the blue single light emitting layer are each obtained by adjusting the ZnMgO content in the light emitting layer (ZnMgO content in the second blue light emitting layer in a case of the blue dual light emitting layer, ZnMgO content in the entire blue single light emitting layer in a case of the blue single light emitting layer) from the exemplary method of Evaluation 4.

Figure 10:
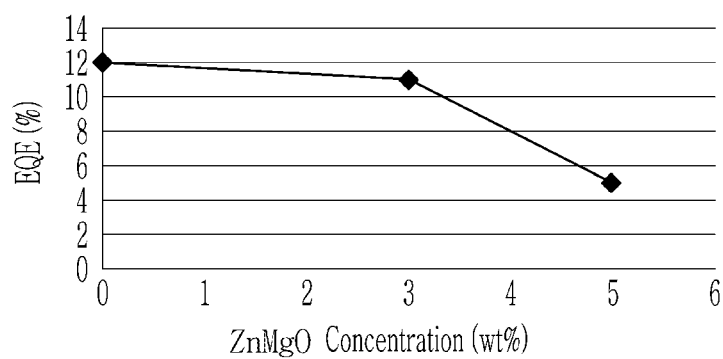
FIGS. 10 and 11 are graphs showing changes in external quantum efficiency (EQE) (FIG. 10) and maximum luminance (unit: Candela per square centimeter ($Cd/cm^2$)) (FIG. 11), respectively, according to the ZnMgO content (unit: wt %) of an electroluminescent device to which a general single light emitting layer is applied.
Figure 11:
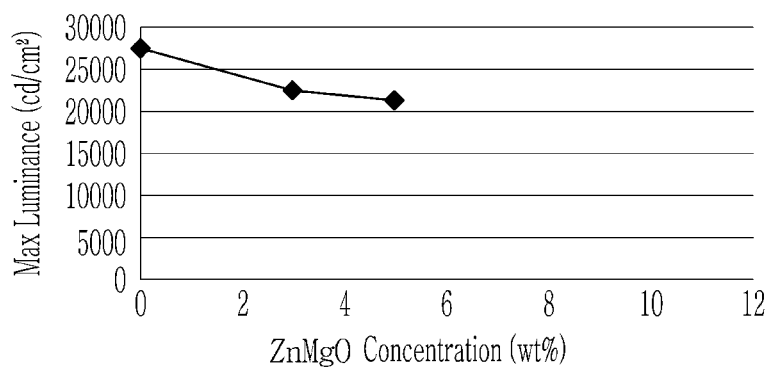

Referring to FIGS. 10 and 11, it is confirmed that in the case of the electroluminescent device including the blue single light emitting layer, the external quantum efficiency and maximum luminance tend to be gradually even decreased as the ZnMgO content is getting increased.

Figure 12:
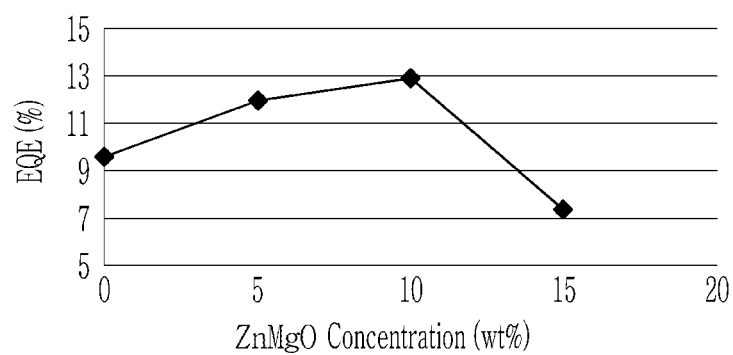
FIGS. 12 and 13 are graphs showing changes in external quantum efficiency (EQE) versus ZnMgO concentration (unit: wt %) (FIG. 12) and maximum luminance (unit: $Cd/cm^2$) versus ZnMgO concentration (unit: wt %) (FIG. 13), respectively, according to the ZnMgO content of an electroluminescent device to which a dual light emitting layer according to an embodiment is applied.
Figure 13:
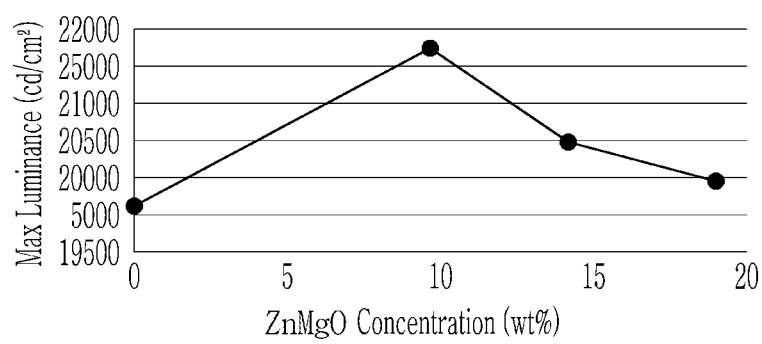

On the contrary, referring to FIGS. 12 and 13, it is confirmed that in the case of the electroluminescent device including the blue dual light emitting layer, both the external quantum efficiency and the maximum luminance tend to be increased as the ZnMgO content is increased until the ZnMgO content in the second blue light emitting layer reaches to a predetermined amount (in FIGS. 12 and 13, for example, about 11 wt %). But it is confirmed that both the external quantum efficiency and the maximum luminance are even decreased as the ZnMgO content is getting increased when the ZnMgO content is greater than the predetermined amount (e.g., greater than about 11 wt %).

Thus from the results of FIGS. 10 to 13, it is confirmed that in the electroluminescent device having the blue dual light emitting layer, when the ZnMgO content in the second blue light emitting layer is greater than 0 to 11 wt %, it show more excellent light emitting characteristics than the electroluminescent device having the blue single light emitting layer and/or the blue dual light emitting layer including no ZnMgO.

Example 7

An electroluminescent device according to Example 7 [ITO/PEDOT/TFB/Red QD/Red QD:ZnMgO (15 wt %)/ZnMgO/Al] is obtained in accordance with the same procedure as in Example 1, except that the compositions for forming the first, second red light emitting layers are formed using a red quantum dot solution that InP/ZnSe/ZnS core-shell red quantum dots (average particle diameter: 12 nm, peak wavelength: about 630 nm, HOMO energy level: −5.55 eV, LUMO energy level: −3.58 eV) are dispersed in octane as a hydrophobic ligand on the surface instead of blue quantum dots, and the adding amount of ZnMgO in the second red light emitting layer is adjusted so that the content ZnMgO in the second red light emitting layer is 15 wt % where the first red light emitting layer (thickness: 20 nm) and the second red light emitting layer (thickness: 18 nm) are formed using the composition for forming first, second red light emitting layers.

Comparative Example 6

An electroluminescent device according to Comparative Example 5 is obtained [ITO/PEDOT/TFB/Red QD/ZnMgO/Al] in accordance with the same procedure as in Comparative Example 1, except that the red single light emitting layer (thickness: 20 nm) is formed by using InP/ZnSe/ZnS core-shell red quantum dots (average particle diameter: 12 nm, peak wavelength: about 630 nm, HOMO energy level: −5.55 eV, LUMO energy level: −3.58 eV) having attached oleate as a hydrophobic ligand onto the surface instead of the blue quantum dots.

Evaluation 6: Light Emitting and Life-Span Characteristics of Red Dual Emitting Layer Including ZnMgO The electroluminescent devices according to Example 7 and Comparative Example 6 are measured for light emitting characteristics and life-span characteristics, and the results are shown in FIGS. 14 to 17.

Figure 14:
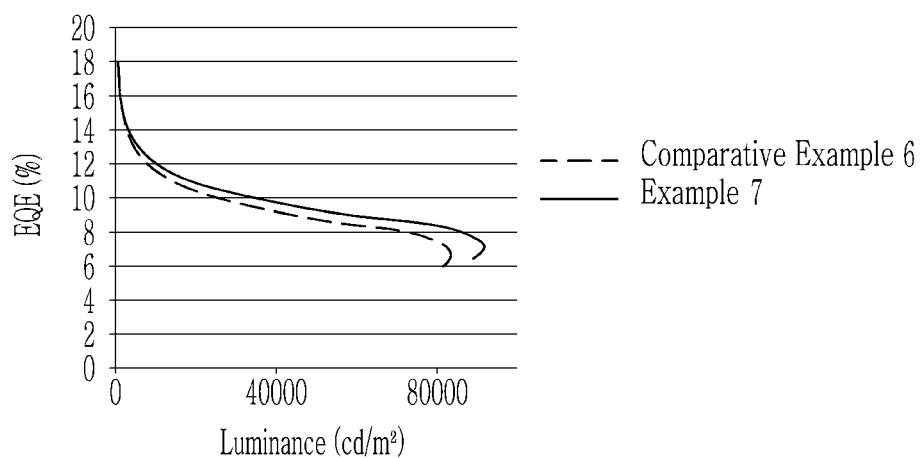
FIG. 14 is an EQE (unit: %) versus luminance (unit: $cd/m^2$) graph of the electroluminescent devices according to Example 7 and Comparative Example 6.
Figure 15:
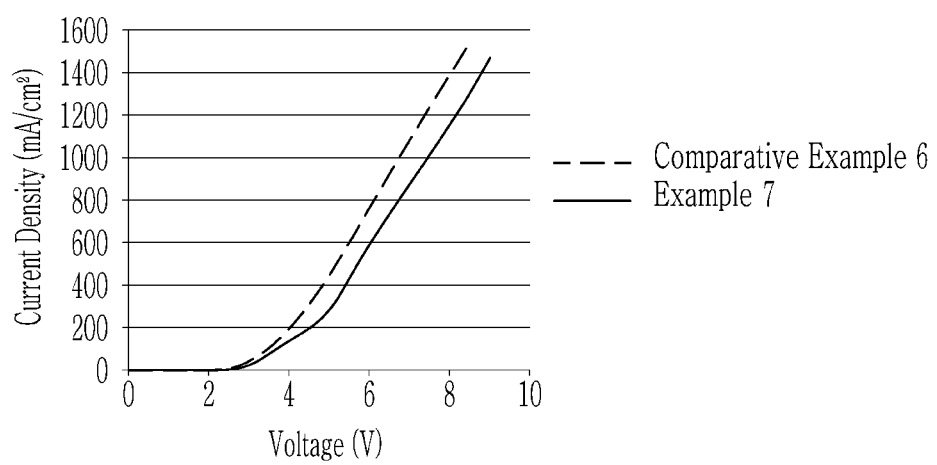
FIG. 15 is a current density (unit: $mA/cm^2$) versus voltage (unit: voltage(v)) graph of the electroluminescent devices according to Example 7 and Comparative Example 6.
Figure 16:
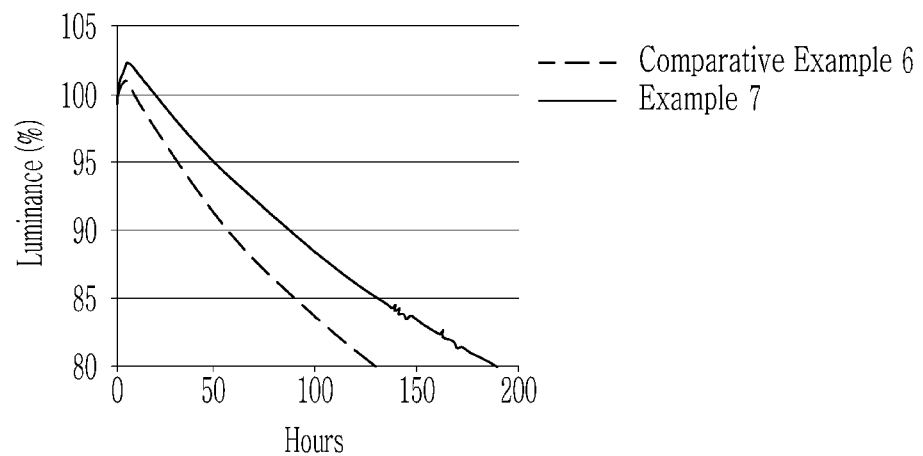
FIG. 16 is a luminance (unit: %) versus time (unit: hours) graph of the electroluminescent devices according to Example 7 and Comparative Example 6.
Figure 17:
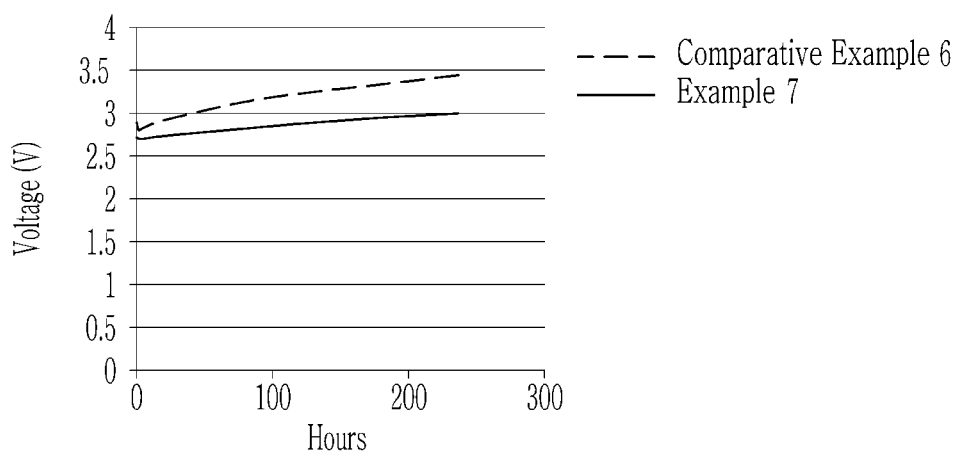
FIG. 17 is a voltage (v) versus time (unit: hours) graph of the electroluminescent devices according to Example 7 and Comparative Example 6.

FIG. 14 is an EQE (unit: %) versus a luminance (unit: cd/m$^2$) graph of the electroluminescent devices according to Example 7 and Comparative Example 6, FIG. 15 is a current density (unit: mA/cm$^2$) versus voltage (unit: voltage(v)) graph of the electroluminescent devices according to Example 7 and Comparative Example 6, FIG. 16 is a luminance (unit: %) versus time (unit: hours) graph of the electroluminescent devices according to Example 7 and Comparative Example 6, and FIG. 17 is a voltage (v) versus time (unit: hours) graph of the electroluminescent devices according to Example 7 and Comparative Example 6.

Referring to FIGS. 14 to 15, the electroluminescent device according to Example 7 shows more excellent driving efficiency and luminous efficiency than the electroluminescent device according to Comparative Example 6, particularly, the electroluminescent device according to Example 7 more improves leakage current than in Comparative Example 6.

In addition, referring to FIGS. 16 to 17, it is confirmed that the electroluminescent device according to Example 7 has more excellent life-span characteristics than the electroluminescent device (red single light emitting layer) according to Comparative Example 6.

When the electroluminescent device includes red quantum dots, the appropriate ZnMgO content capable of being included in the second red light emitting layer may be slightly different from that of Evaluation 5, which seems to be caused by the quantum dot difference between the blue light emitting element and the red light emitting element.

Accordingly, from the results of FIGS. 14 to 17, it is understood that the case of the electroluminescent device including the red dual light emitting layer shows more excellent light emitting and life-span characteristics than the electroluminescent device including the red single light emitting layer.

Evaluation 7: Life-Span Characteristics According to the Charge Balance Factor

In the electroluminescent device according to Example 4, the electron transport capability (ET) and the hole transport capability (HT) are measured while adjusting the content of CBP in the first blue light emitting layer and the content of ZnMgO in the second blue light emitting layer, the charge balance factor (CBF) are calculated, and the results are shown in Table 5.

In addition, after measuring the life-span characteristics (e.g., T50) for each case, and the results are also shown in Table 5.

TABLE 5

|   | HT(mA/cm$^2$) | ET(mA/cm$^2$) | CBF(HT/ET) | T50(Normalized) |
|---|---|---|---|---|
| 1 | 0.5 | 3.7 | 0.14 | 1.5 |
| 2 | 0.8 | 4.0 | 0.20 | 1.5 |
| 3 | 0.8 | 4.0 | 0.20 | 1.3 |
| 4 | 1.5 | 4.0 | 0.38 | 2.1 |
| 5 | 1.5 | 4.0 | 0.38 | 1.9 |
| 6 | 1.5 | 5.0 | 0.30 | 2.2 |
| 7 | 1.5 | 5.4 | 0.28 | 2.6 |
| 8 | 0.5 | 4.0 | 0.13 | 1.4 |
| 9 | 0.5 | 4.0 | 0.13 | 1.3 |
| 10 | 3.0 | 5.4 | 0.56 | 1.6 |

To measure the hole transport capability, the HOD [ITO (200 nm)/PEDOT:PSS (30 nm)/TFB (25 nm)/Blue QD:CBP (20 nm)/GSH0137 (36 nm)/HAT-CN (10 nm)/Ag (100 nm)] is obtained in accordance with the same procedure as in Verification Example 1, and the current density with respect to the voltage for the manufactured HOD is measured using a Keithley 2635B source meter to evaluate the hole transport capability.

In addition, to measure the electron transport capability, the EOD [ITO (200 nm)/ZnMgO (20 nm)/Blue QD:ZnMgO (20 nm)/ZnMgO (20 nm)/Al (100 nm)] is obtained in accordance with the same procedure as in Verification Example 2, and the current density with respect to the voltage for the manufactured EOD is measured using a Keithley 2635B source meter to evaluate the electron transport capability.

Referring to Table 5, when the charge balance factor is less than or equal to about 0.20 and greater than or equal to about 0.56, it can be seen that T50 is remarkably reduced, and it is predicted that the charge balance factor of the light emitting layer is an important factor for the life-span characteristics.

Example 8

An electroluminescent device according to Example 8 [ITO/PEDOT/TFB/Blue QD/Blue QD:ZnMgO (3 wt %)/Al] is obtained in accordance with the same procedure as in Example 1, except that the second electrode is disposed on the second blue light emitting layer without the electron transport layer.

Example 9

An electroluminescent device according to Example 9 [ITO/PEDOT/TFB/Blue QD/Blue QD:ZnMgO (5 wt %)/Al] is obtained in accordance with the same procedure as in Example 2, except that the second electrode is disposed on the second blue light emitting layer without the electron transport layer.

Example 10

An electroluminescent device according to Example 10 [ITO/PEDOT/TFB/Blue QD/Blue QD:ZnMgO (10 wt %)/Al] is obtained in accordance with the same procedure as in Example 3, except that the second electrode is disposed on the second blue light emitting layer without the electron transport layer.

Comparative Example 7

An electroluminescent device according to Comparative Example 7 [ITO/PEDOT/TFB/Blue QD/Al] is obtained in accordance with the same procedure as in Comparative Example 1, except that the second electrode is formed on the blue light emitting layer without the electron transport layer.
Evaluation 8: Light Emitting Characteristic of the Electroluminescent Device without the Electron Transport Layer The manufactured electroluminescent device is evaluated for the light emitting Characteristic using a Keithley 2200 source measuring instrument and a Minolta CS2000 spectroradiometer (current-voltage-luminance measuring instrument), and the results are shown in FIG. 18 and FIG. 19.

Figure 18:
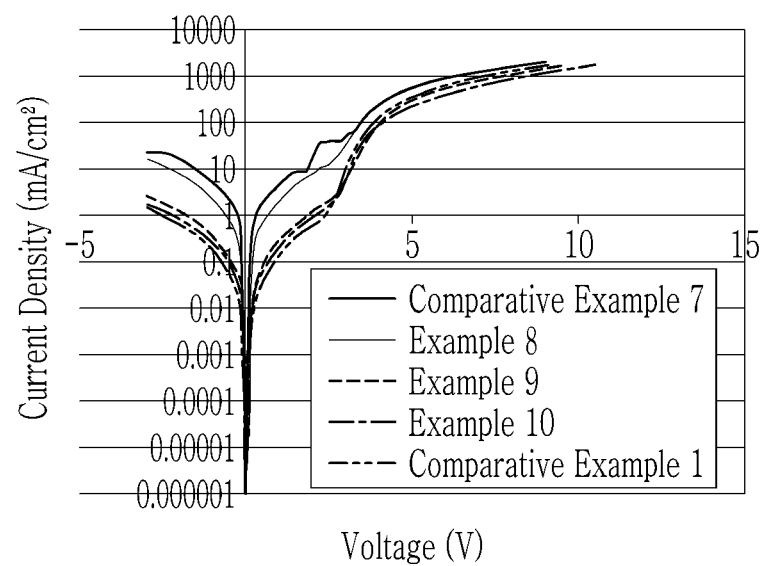
FIG. 18 is a current density (unit: $mA/cm^2$) versus voltage (v) graph of the electroluminescent devices according to Examples 8 to 10, Comparative Example 1 and Comparative Example 7.

FIG. 18 is a current density (unit: $mA/cm^2$) versus voltage (v) graph of the electroluminescent devices according to Examples 8 to 10, Comparative Example 1 and Comparative Example 7, and FIG. 19 is an EQE (%) versus luminance (unit: $cd/m^2$) graph of the electroluminescent devices according to Examples 9 and 10 and Comparative Example 1.

Figure 19:
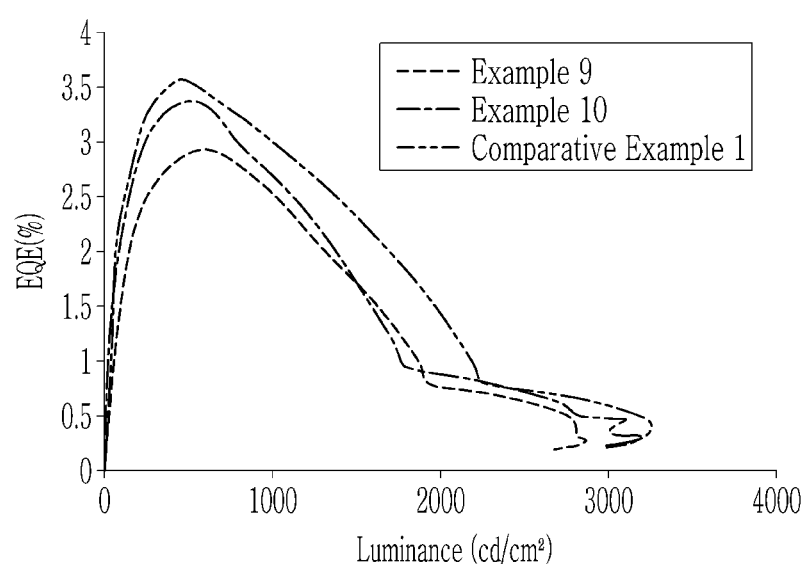
FIG. 19 is an EQE (unit: %) versus luminance (unit: $cd/m^2$) graph of the electroluminescent devices according to Examples 9 and 10 and Comparative Example 1.

Referring to FIG. 18 and FIG. 19, as the second light emitting layer includes the n-type metal oxide, the hole blocking property of the second light emitting layer 142 increases, so that the electroluminescent device without the electron transport layer may have similar characteristics to the electroluminescent device with the electron transport layer.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: electroluminescent device | 100: substrate |
| 110: first electrode | 120: hole injection layer |
| 130: hole transport layer | 140: light emitting layer |
| 141: first light emitting layer | 141a: first quantum dot |
| 141b: p-type semiconductor | 142: second light emitting layer |
| 142a: second quantum dot | 142b: n-type metal oxide |
| 150: electron transport layer | 160: second electrode |

What is claimed is:

1. An electroluminescent device, comprising
a first electrode and a second electrode facing each other; and
a light emitting layer disposed between the first electrode and the second electrode;
wherein the light emitting layer comprises a first light emitting layer disposed on the first electrode and comprising a first quantum dot, and a second light emitting layer disposed on the second electrode and comprising a second quantum dot and an n-type metal oxide.

2. The electroluminescent device of claim 1, wherein
the second quantum dot emits first light in a predetermined wavelength region, and
the n-type metal oxide is included in an amount of greater than about 0 percentages by weight (wt %) and less than or equal to about 20 wt % based on a total weight of the second light emitting layer.

3. The electroluminescent device of claim 1, wherein the n-type metal oxide comprises an oxide of a metal comprising zinc (Zn), magnesium (Mg), tin (Sn) zirconium (Zr), titanium (Ti), aluminum (Al), or a combination thereof.

4. The electroluminescent device of claim 1, wherein the n-type metal oxide is dispersed in the second light emitting layer.

5. The electroluminescent device of claim 1, wherein the n-type metal oxide comprises a hydrophobic organic material attached to at least a portion of a surface of the n-type metal oxide.

6. The electroluminescent device of claim 1, wherein an average particle diameter of the n-type metal oxide is about 1 nanometers (nm) to about 10 nm.

7. The electroluminescent device of claim 1, wherein the first light emitting layer further comprises a p-type semiconductor.

8. The electroluminescent device of claim 7, wherein the p-type semiconductor comprises a p-type monomolecular organic semiconductor, a p-type oxide semiconductor, or a combination thereof.

9. The electroluminescent device of claim 7, wherein the p-type semiconductor is included in an amount of greater than about 0 wt % and less than or equal to about 20 wt % based on a total weight of the first light emitting layer.

10. The electroluminescent device of claim 1, wherein the light emitting layer has a charge balance factor of greater than about 0.20 and less than about 0.56, which is a ratio of a hole transport capability to an electron transport capability.

11. The electroluminescent device of claim 1, wherein the light emitting layer has a thickness of about 10 nm to about 60 nm.

12. The electroluminescent device of claim 1, wherein at least one of the first quantum dot and the second quantum dot comprise a core comprising a first semiconductor nanocrystal and a shell comprising a second semiconductor nanocrystal having a composition different from the first semiconductor nanocrystal and disposed on the core.

13. The electroluminescent device of claim 1, wherein a ligand comprising a moiety derived from metal halide compound, a moiety derived from carboxylic acid-base compound, a moiety derived from thiol compound, or a combination thereof is attached to at least one of the first quantum dot and the second quantum dot.

14. The electroluminescent device of claim 1, further comprising:
a hole transport layer disposed between the first electrode and the light emitting layer.

15. The electroluminescent device of claim 14, wherein the hole transport layer comprises a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine (m-MTDATA), poly[N,N'-bis(4-butylphenyl)-N,N'-bis(phenyl)benzidine, NiO, $MoO_3$, or a combination thereof.

16. The electroluminescent device of claim 1, further comprising an electron transport layer disposed between the second electrode and the light emitting layer.

17. The electroluminescent device of claim 16, wherein the electron transport layer comprises an inorganic material nanoparticle, a quinolone compound, a triazine-based compound, a quinoline-based compound, a triazole-based compound, a naphthalene-based compound, or a combination thereof.

18. The electroluminescent device of claim 17, wherein the inorganic material nanoparticle comprises a salt of a metal comprising zinc (Zn), magnesium (Mg), tin (Sn) zirconium (Zr), titanium (Ti), aluminum (Al), or a combination thereof.

19. The electroluminescent device of claim 1, further comprising:
   a hole transport layer disposed between the first electrode and the first light emitting layer and comprising an organic material, and
   an electron transport layer disposed between the second electrode and the second light emitting layer and comprising an inorganic material, and wherein the first light emitting layer comprises a p-type organic material.

20. A display device comprising the electroluminescent device of claim 1.

* * * * *